(12) United States Patent
Kurikawa et al.

(10) Patent No.: US 9,882,561 B2
(45) Date of Patent: Jan. 30, 2018

(54) INPUT DEVICE

(71) Applicant: FUJIKURA LTD., Tokyo (JP)

(72) Inventors: Yohei Kurikawa, Tokyo (JP); Wataru Kondo, Tokyo (JP); Makoto Takamatsu, Sakura (JP); Yoshinori Sano, Tokyo (JP); Toshimizu Tomitsuka, Sakura (JP); Yasushi Ono, Sakura (JP); Osamu Aoki, Sakura (JP); Shinsuke Aoshima, Sakura (JP); Yasuyuki Tachikawa, Sakura (JP)

(73) Assignee: FUJIKURA LTD., Koto-ku, Tokyo (JP)

( * ) Notice: Subject to any disclaimer, the term of this patent is extended or adjusted under 35 U.S.C. 154(b) by 216 days.

(21) Appl. No.: 14/565,699

(22) Filed: Dec. 10, 2014

(65) Prior Publication Data

US 2015/0090579 A1 Apr. 2, 2015

Related U.S. Application Data

(63) Continuation of application No. PCT/JP2013/066057, filed on Jun. 11, 2013.

(30) Foreign Application Priority Data

Jun. 12, 2012 (JP) .................................. 2012-133301
Jun. 12, 2012 (JP) .................................. 2012-133302

(51) Int. Cl.
*H03K 17/975* (2006.01)
*H03K 17/96* (2006.01)
(Continued)

(52) U.S. Cl.
CPC ......... *H03K 17/962* (2013.01); *H03K 17/955* (2013.01); *H03K 17/975* (2013.01);
(Continued)

(58) Field of Classification Search
CPC .. H03K 17/962; H03K 17/955; H03K 17/975; H03K 2017/9613;
(Continued)

(56) References Cited

U.S. PATENT DOCUMENTS 5,270,710 A * 12/1993 Gaultier ............... H03K 17/967
200/600
2002/0190727 A1 12/2002 Morimoto
(Continued)

FOREIGN PATENT DOCUMENTS

CN 101561737 A 10/2009
JP 2001-74404 A 3/2001
(Continued)

OTHER PUBLICATIONS

Communication dated Dec. 4, 2015, issued by the State Intellectual Property Office of the P.R.C. in corresponding Chinese Application No. 201380030117.8.
(Continued)

*Primary Examiner* — Edwin A. Leon
*Assistant Examiner* — Lheiren Mae A Caroc
(74) *Attorney, Agent, or Firm* — Sughrue Mion, PLLC

(57) ABSTRACT

An input device includes an insulation substrate, a switch element, and a detection portion. The switch element includes a fixed electrode portion that is provided on the substrate, and a movable electrode portion that is provided on a main surface side of the substrate, at least part of the movable electrode portion being elastically displaceable toward a direction approaching and leaving the fixed electrode portion. The movable electrode portion is displaceable toward a direction approaching the fixed electrode portion due to pressure from an object to be detected that is an electric conductor. The detection portion is capable of detecting a capacitance change caused by the object to be
(Continued)

detected approaching and leaving the movable electrode portion and a capacitance change between the movable electrode portion and the fixed electrode portion produced by displacement of the movable electrode portion due to pressing.

12 Claims, 26 Drawing Sheets

(51) Int. Cl.
  *H03K 17/955* (2006.01)
  *H01H 13/702* (2006.01)
(52) U.S. Cl.
  CPC ..... *H01H 13/702* (2013.01); *H01H 2215/004* (2013.01); *H03K 2017/9613* (2013.01); *H03K 2217/96062* (2013.01); *H03K 2217/96076* (2013.01); *H03K 2217/960745* (2013.01); *H03K 2217/960755* (2013.01)
(58) Field of Classification Search
  CPC ........ H03K 2217/96076; H03K 2217/960755; H03K 2217/960745; H03K 2217/96062; H01H 2215/004; H01H 13/702
  USPC ......................................... 200/600, 512, 513
  See application file for complete search history.

(56) References Cited

U.S. PATENT DOCUMENTS

| 2008/0202251 | A1* | 8/2008 | Serban .................... G01L 1/142 73/780 |
|---|---|---|---|
| 2009/0262095 | A1 | 10/2009 | Kinoshita et al. |

FOREIGN PATENT DOCUMENTS

| JP | 2005-353565 | A | 12/2005 |
|---|---|---|---|
| JP | 2006-222022 | A | 8/2006 |
| JP | 2007-18839 | A | 1/2007 |
| JP | 4049703 | B2 | 2/2008 |
| JP | 2008-52620 | A | 3/2008 |
| JP | 2010-123367 | A | 6/2010 |
| JP | 2011-81910 | A | 4/2011 |
| JP | 4717757 | B2 | 7/2011 |
| JP | 2011-243399 | A | 12/2011 |
| JP | 2012-84002 | A | 4/2012 |
| TW | I242226 | | 10/2005 |
| TW | M392426 | U1 | 11/2010 |
| WO | 02/073148 | A1 | 9/2002 |
| WO | 2008/052229 | A2 | 5/2008 |
| WO | 2010/035705 | A1 | 4/2010 |

OTHER PUBLICATIONS

Notice of Reasons for Rejection for Japanese Patent Application No. 2012-133301, dated Mar. 19, 2013.
International Search Report of PCT/JP2013/066057, dated Jul. 9, 2013. [PCT/ISA/210].
Communication dated Mar. 5, 2013, issued by the Japan Patent Office in corresponding Japanese Application No. 2012-133302.
Communication dated May 28, 2013, issued by the Japan Patent Office in corresponding Japanese Application No. 2012-133302.
Communication dated Nov. 18, 2014, issued by the Japan Patent Office in corresponding Japanese Application No. 2014-521341.
Communication dated Dec. 15, 2014, issued by the Taiwan Patent Office in corresponding Taiwanese Application No. 102120725.
Communication dated Feb. 17, 2015, issued by the Japan Patent Office in corresponding Japanese Application No. 2014-521341.
Communication dated May 26, 2015 from the European Patent Office in counterpart application No. 13804744.4.
Communication dated Apr. 21, 2017, issued from the Europe Patent Office in counterpart European Application No. 13804744.4.

\* cited by examiner

INPUT DEVICE

CROSS REFERENCE TO RELATED APPLICATIONS

This application is a continuation application based on a PCT Patent Application No. PCT/JP2013/066057, filed Jun. 11, 2013, whose priority is claimed on Japanese Patent Applications No. 2012-133301 filed Jun. 12, 2012 and No. 2012-133302 filed Jun. 12, 2012, the entire contents of which are hereby incorporated by reference.

BACKGROUND OF THE INVENTION

Field of the Invention

The present invention relates to an input device that is used for an electronic device, for example, a mobile phone such as a smartphone, a mobile information device such as a personal digital assistant (PDA) and a tablet terminal, a personal computer, and a touch panel.

Description of the Related Art

In a mobile phone and the like, an input device including one or more switch elements is employed (for example, see Japanese Patent Publication No. 4049703).

Japanese Patent Publication No. 4049703 discloses an input device including a contact electrode, an inversion member that contacts the contact electrode due to pressure from an operator, and a position detection means that detects a capacitance change when a finger of an operator or the like (object to be detected) approaches thereto.

In the above-described input device, a capacitance change and an electrical connection between the inversion member and the contact electrode need to be detected, and thus, both a circuit for detecting the capacitance change and a circuit for detecting the electrical connection should be mounted, or two integrated circuits having each detection function needs to be employed. This raises difficulties in reducing costs, ease of manufacture, downsizing a device and the like, since an internal configuration of the device becomes complex.

In addition, a cooking device including an input device is disclosed in Japanese Unexamined Patent Application, First Publication No. 2011-081910, an input device including a capacitance sensor 20 is disclosed in Japanese Unexamined Patent Application, First Publication No. 2008-052620, and an input device including a switch mechanism 2 is disclosed in Japanese Unexamined Patent Application, First Publication No. 2010-123367. Furthermore, an input device including a switch input means, an inversion member, and a contact electrode 9 is disclosed in Japanese Patent Publication No. 4049703, a capacitance-type switch including a fixed electrode and a movable electrode is disclosed in Japanese Unexamined Patent Application, First Publication No. 2006-222022, and a capacitance-type sensor including a substrate which has a fixed electrode and the like, an conductive rubber-plate, and a rubber plate is disclosed in Japanese Unexamined Patent Application, First Publication No. 2001-74404.

SUMMARY OF THE INVENTION

The present invention has been made in view of the above-described circumstances, and aims at in an input device that detects a position and a pressing operation of an object to be detected, providing an input device in which an internal circuit configuration can be simplified.

In order to solve the above-described objects, the present invention provides the following structure.

An aspect of the present invention is to provide an input device including an insulation substrate, a switch element provided on the substrate, and a detection portion that detects a capacitance change at the switch element, where: the switch element includes a fixed electrode portion that is provided on the substrate, and a movable electrode portion that is provided on the main surface side of the substrate, at least part of the movable electrode portion being elastically displaceable toward a direction approaching and leaving the fixed electrode portion; the movable electrode portion is displaceable toward a direction approaching the fixed electrode portion due to pressure from an object to be detected that is an electric conductor; the detection portion is capable of detecting a capacitance change caused by the object to be detected approaching and leaving the movable electrode portion and a capacitance change between the movable electrode portion and the fixed electrode portion produced by displacement of the movable electrode portion due to pressing; and the fixed electrode portion is electrically insulated with respect to the movable electrode portion and is connected to ground.

The movable electrode portion is preferably a domical shape or an arch shape which is protruded toward a direction leaving the substrate, and an approximate center portion is preferably elastically displaceable toward a direction approaching and leaving the fixed electrode portion.

It is preferable that the movable electrode portion is electrically connected to an external electrode portion provided on a main surface side of the substrate; and the external electrode portion is formed at a periphery of the fixed electrode portion when seen from a planar view, and has a distance to the fixed electrode portion that is greater than a distance of maximum displacement toward a direction approaching and leaving the fixed electrode portion of the movable electrode portion.

It is preferable that the external electrode portion is formed at a region comprising the movable electrode portion when seen from a planar view; and an outside dimension of the external electrode portion is 1.5 times larger than an outside dimension of the movable electrode portion.

The fixed electrode portion is preferably provided at a surface side which is opposite to the main surface side of the substrate.

It is preferable that a height adjustment unit that regulates a shift of the movable electrode portion toward a direction approaching the substrate is formed at the main surface side of the substrate.

The height adjustment unit is preferably formed in laminate along the main surface.

In an aspect of the present invention, it is preferable that the fixed electrode portion is provided on the main surface side of the substrate, and at least on a surface of the movable electrode portion side of the fixed electrode portion, an insulation portion is formed that prevents the movable electrode portion from being electrically connected to the fixed electrode portion when the movable electrode portion is displaced toward a direction approaching the fixed electrode portion.

The insulation portion is preferably made of one or more resins selected from a group of an acrylic resin, a urethane resin, a polyester resin, a polyimide resin, and an epoxide resin.

Preferably, relative permittivity of the insulation portion is 1.5 to 10.

A thickness of the insulation portion is preferably 5 μm or more.

It is preferable that a difference in height between an upper surface of the insulation layer and an upper surface of the external electrode portion based on the main surface of the substrate is 0 or more, and is within a range of less than or equal to one-tenth of a distance between the fixed electrode portion and a portion of the movable electrode portion that faces to the fixed electrode portion.

According to the aspect of the present invention, with a detection portion, it is possible to detect a capacitance change due to a position change, and also to detect a capacitance change when the movable electrode portion is displaced due to a pressing operation of the switch element. As a result, a circuit for detecting a position of the object to be detected and a circuit for detecting a pressing operation of the movable electrode portion can be a common circuit, and thereby, a circuit configuration inside the device can be simplified. Therefore, it is advantageous for reducing costs, ease of manufacture and downsizing the device.

In addition, the pressing operation of the movable electrode portion is detected by the capacitance change. Therefore, compared to a configuration that detects the pressing operation by the electrical connection of the electrode portion, a current flowing in the circuit at the time of the detection does not increase rapidly, and failures caused by the rapid increase of the current do not occur.

In the aspect of the present invention, unlike the configuration that detects the pressing operation by the electrical connection of the electrode portion, the contact failure does not occur that is caused by foreign substance contamination, corrosion of the electrode portion and the like. Therefore, the detection sensitivity does not decrease.

In the aspect of the present invention, since the fixed electrode portion is provided at a surface side which is opposite to the main surface side of the substrate, it is possible to reliably insulate between the fixed electrode portion and the movable electrode portion. Therefore, detection failure of capacitance due to the electrical connection between both electrodes does not occur.

According to the aspect of the present invention, with a single detection portion, it is possible to detect a capacitance change due to a position change when the object to be detected approaches and leaves, and also to detect a capacitance change when the movable electrode portion is displaced due to a pressing operation of the switch element. In particular, a capacitance change in two stages can be detected by a single detection portion. As a result, a circuit for detecting a position of the object to be detected and a circuit for detecting a pressing operation of the movable electrode portion can be a common circuit, and thereby, a circuit configuration inside the device can be simplified. Therefore, it is advantageous for reducing costs, ease of manufacture and downsizing the device.

Furthermore, the pressing operation of the movable electrode portion is detected by the capacitance change. Therefore, compared to a configuration that detects the pressing operation by the electrical connection of the electrode portion, a current flowing in the circuit at the time of the detection does not increase rapidly, and failures caused by the rapid increase of the current do not occur.

In the aspect of the present invention, unlike the configuration that detects the pressing operation by the electrical connection of the electrode portion, the contact failure does not occur that is caused by foreign substance contamination, corrosion of the electrode portion and the like. Therefore, the detection sensitivity does not decrease.

In the aspect of the present invention, since both fixed electrode portion and movable electrode portion are provided on the main surface of the substrate, an inexpensive one-side substrate can be used, and thus, it is possible to reduce costs.

DETAILED DESCRIPTION OF THE PREFERRED EMBODIMENTS

Figure 1:
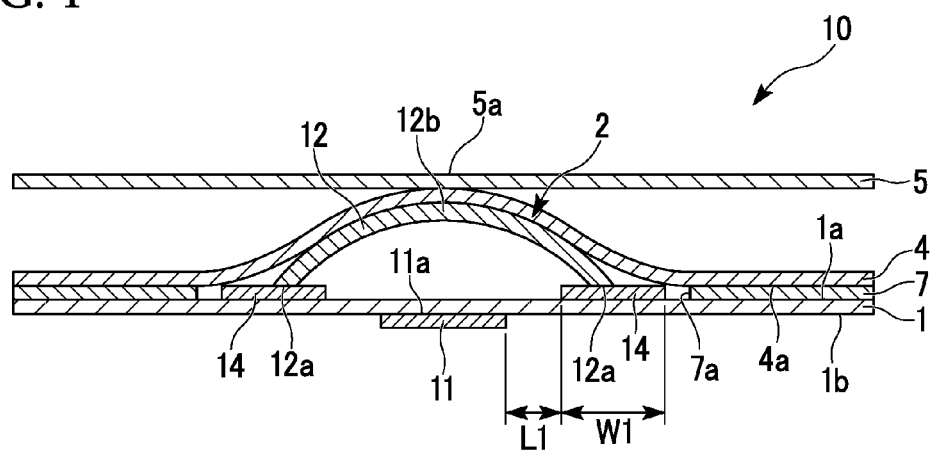
FIG. 1 is a cross-sectional diagram showing an input device of the first exemplary embodiment of the present invention.
Figure 2:
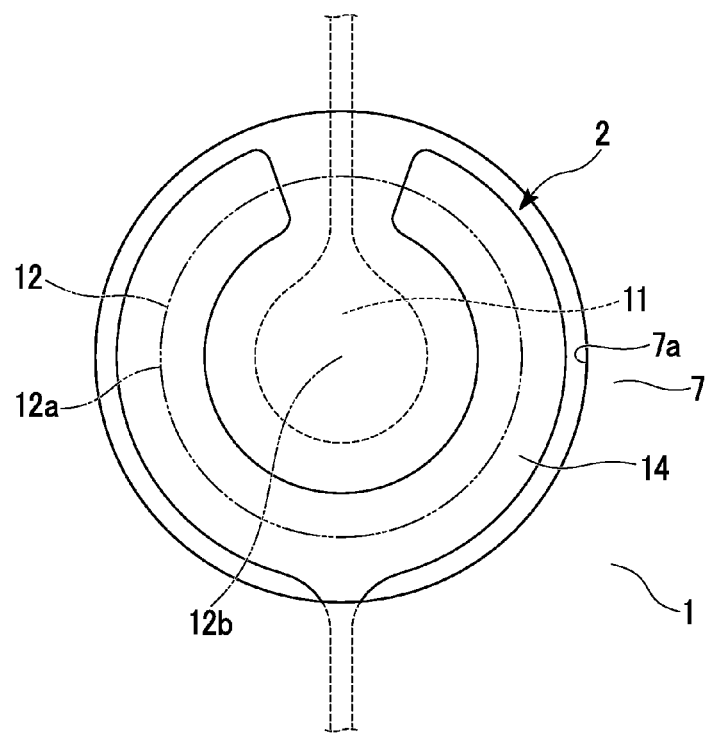
FIG. 2 is a plane diagram showing the input device of FIG. 1.
Figure 3:
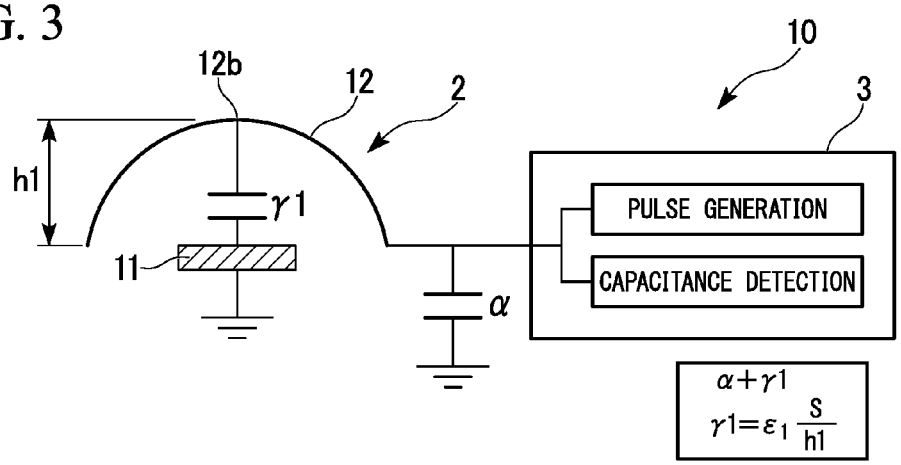
FIG. 3 is a structural diagram schematically showing the input device of FIG. 1.
Figure 4:
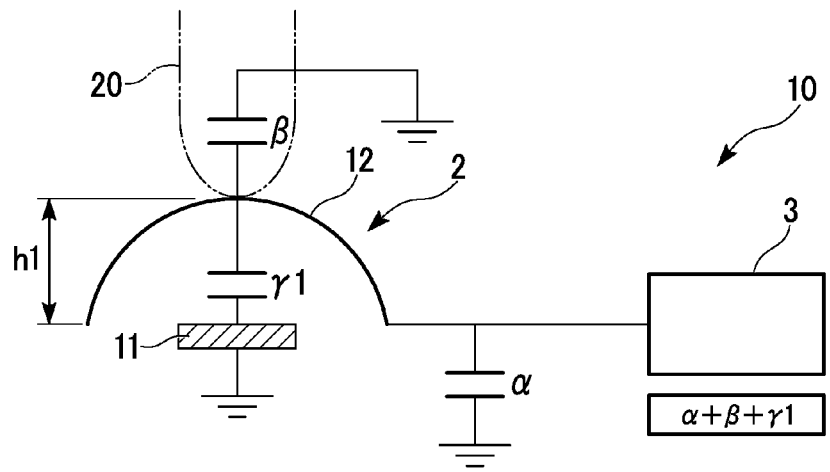
FIG. 4 is a structural diagram schematically showing a state that in the input device of FIG. 1, the object to be detected approaches a movable electrode portion.
Figure 5:
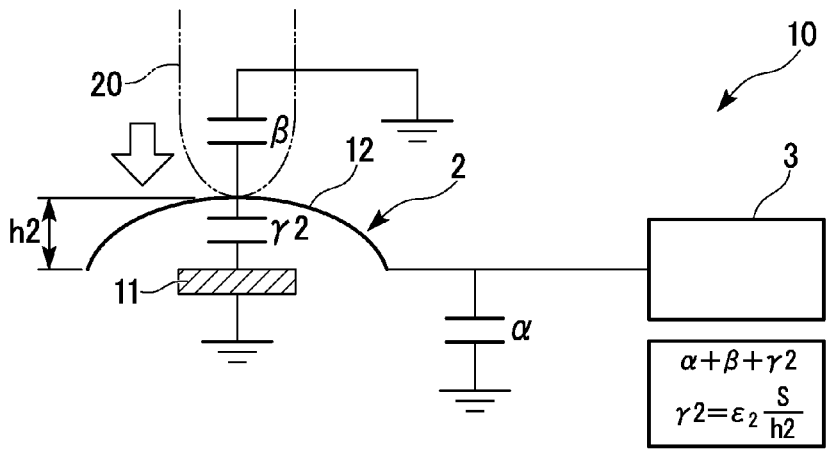
FIG. 5 is a structural diagram schematically showing a state that in the input device of FIG. 1, the object to be detected presses the movable electrode portion.
Figure 6:
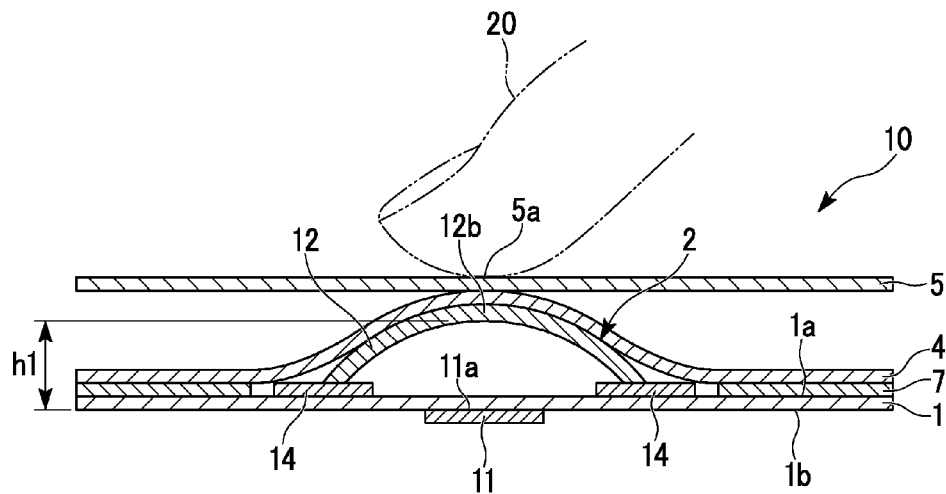
FIG. 6 is a cross-sectional diagram showing a state that in the input device of FIG. 1, the object to be detected approaches a movable electrode portion.
Figure 7:
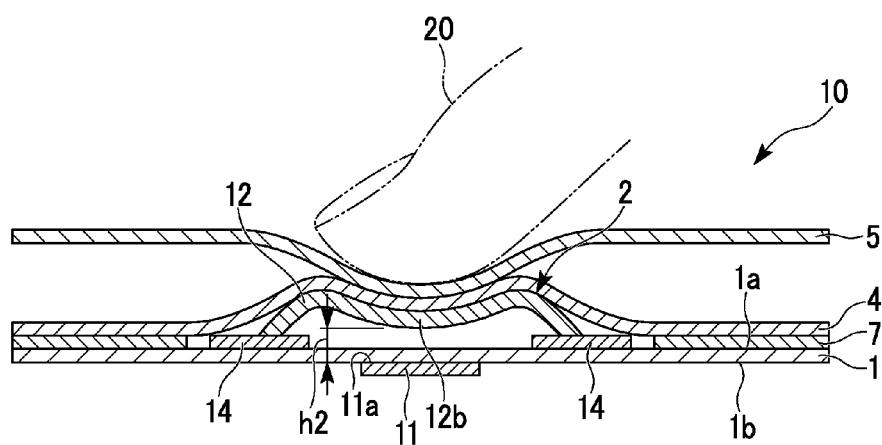
FIG. 7 is a cross-sectional diagram showing a state that in the input device of FIG. 1, the object to be detected presses the movable electrode portion.
Figure 8:
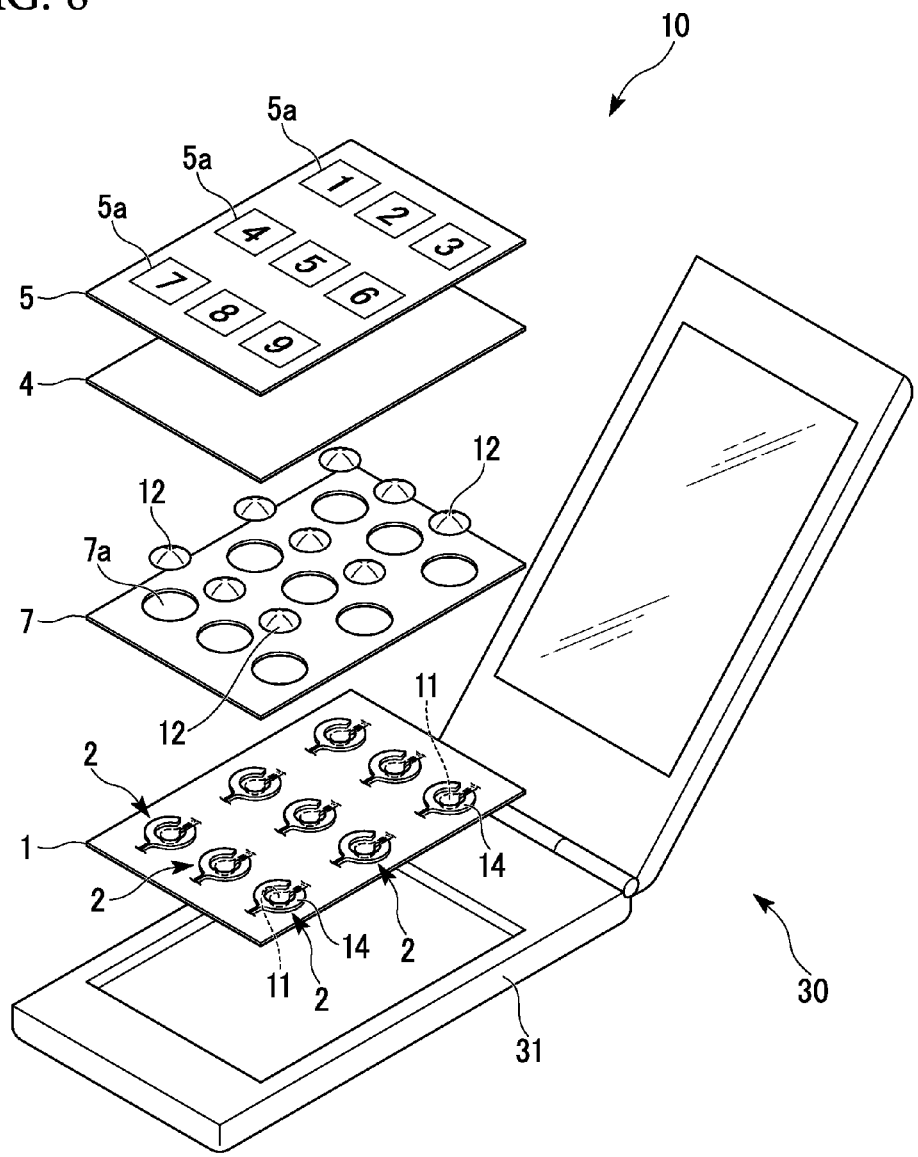
FIG. 8 is a perspective diagram showing an example of an electronic device using the input device of FIG. 1.

FIG. 1 is a cross-sectional diagram showing an input device (input device module) 10 of the first exemplary embodiment of the present invention. FIG. 2 is a plane diagram showing the input device 10. FIG. 3 is a structural diagram schematically showing the input device 10. FIG. 4 is a structural diagram schematically showing a state that an object to be detected 20 approaches a movable electrode portion 12. FIG. 5 is a structural diagram schematically showing a state that the object to be detected 20 presses the movable electrode portion 12. FIG. 6 is a cross-sectional diagram showing a state that the object to be detected 20 approaches the movable electrode portion 12. FIG. 7 is a cross-sectional diagram showing a state that the object to be detected 20 presses the movable electrode portion 12. FIG. 8 is a perspective diagram showing an example of an electronic device using the input device 10.

In the description below, a height direction refers to an upper direction (direction perpendicular to and apart from the substrate 1) in FIG. 1.

FIG. 8 shows a mobile phone that is an example of an electronic device using the input device 10. The input device 10 is provided on a main body portion 31 of a mobile phone 30.

As shown in FIGS. 1-3, the input device 10 includes a substrate 1, a switch element 2 provided on a main surface 1a of the substrate 1, a detection portion 3 that detects a capacitance change at the switch element 2, a press sheet 4 that covers the switch element 2, and an exterior sheet 5 that covers the press sheet 4.

As the substrate 1, one or more insulation materials such as polyimide, polyethylene terephthalate (PET), polyester resin, aramid resin, liquid crystal polymer, glass, and the like can be used. For example, a printed wiring substrate such as a flexible printed circuit (FPC) and a printed circuit board (PCB) can be used.

The relative permittivity of the substrate 1 can be 1.5-10, for example. By setting the relative permittivity within the range, the capacitance between the fixed electrode portion 11 and the movable electrode portion 12 can be increased and the detection sensitivity can be improved.

A thickness of the substrate 1 can be 10-500 μm, for example. By setting the thickness of the substrate 1 within the range, the insulation between the fixed electrode portion 11 and the movable electrode portion 12 is reliably enabled. In addition, capacitance between the fixed electrode portion 11 and the movable electrode portion 12 is increased and the detection sensitivity can be improved.

On the main surface 1a, a wiring layer (not shown) formed of an electric conductive material such as silver, copper, and the like can be formed, and through the wiring layer, each electrode portion and the detection portion 3 can be electrically connected.

The substrate 1 functions as an insulation portion that electrically insulates the fixed electrode portion 11 and the movable electrode portion 12.

The switch element 2 includes a fixed electrode portion 11 provided on a rear surface (lower surface in FIG. 1) 1b which is opposite to the main surface 1a, a movable electrode portion 12 where at least part of thereof is provided on a position which overlaps with the fixed electrode portion 11 when seen from a planar view, and an external electrode portion 14 provided on the main surface 1a.

The fixed electrode portion 11 is a conductive portion that is formed of an electric conductive material such as silver, copper, and the like, and shape thereof when seen from a planar view can be an approximate circular form (see FIG. 2). The fixed electrode portion 11 may not be formed of copper, but may be formed of other metals and the like, such as stainless steel and aluminum.

The fixed electrode portion 11 is connected to ground. Therefore, at the fixed electrode portion 11, the potential becomes constant.

Therefore, a capacitance change between the movable electrode portion 12 and the fixed electrode portion 11 due to potential vibration of the fixed electrode portion 11 can be avoided, and the capacitance detection with two stages can be precisely performed.

In addition, it is assumed that the input device is used such that any electronic device is arranged under thereof. In this case, due to noise (i.e., capacitance) generated at the electronic device, a capacitance value between the movable electrode portion and the fixed electrode portion may be disordered. This raises difficulties particularly during the detection of the capacitance change with two stages, since an allowance range of the change per stage is inevitably small compared to the detection of the capacitance change with one stage.

In contrast, in the input device 10, since the potential at the fixed electrode portion 11 can be constant, there is no noise influence. In addition, it is possible to prevent the noise from reaching the movable electrode portion 12 by absorbing the noise at the fixed electrode portion 11.

Therefore, the detection of the capacitance change with two stages can be performed with high accuracy.

The movable electrode portion 12 is a plate-like body (metal plate) formed of an electric conductive material such as metals, and can have a domical shape which is protruded so as to form a convex shape toward an upper direction (direction leaving the substrate 1).

A cross-sectional shape of the movable electrode portion 12 has, for example, a curved shape, and in an example shown in FIG. 1, has an approximate elliptical arc shape. Here, the movable electrode portion 12 is not limited to have a curved shape, but may have a flat shape or a bent shape.

A shape of the movable electrode portion 12 seen from the planar view can be an approximate circular form (see FIG. 2). A base end portion 12a of the movable electrode portion 12 (peripheral portion of the movable electrode portion 12) is fixed on an upper surface of the external electrode portion 14, and electrically connected to the external electrode portion 14.

The movable electrode portion 12 shown in the figures as an example has an outer diameter which is larger than that of the fixed electrode portion 11 and covers the fixed electrode portion 11.

The movable electrode portion 12 can be formed of metal materials such as stainless steel.

The movable electrode portion 12 has elastically displaceable flexibility in a direction where the center portion 12b approaches and leaves the fixed electrode portion 11 by pressure from an operator. The state of the movable electrode portion 12 is switchable between an undeformed state as shown in FIG. 6 and a state in which the center portion 12b approaches the fixed electrode portion 11 with a center section of the center portion 12b being protruded toward a lower direction as shown in FIG. 7 (pressed state).

A distance between the center portion 12b and the fixed electrode portion 11 when the center portion 12b is at the lowest position (h2 shown in FIG. 7) is 10-500 μm, for example. By setting the distance within the range, the insulation between the fixed electrode portion 11 and the movable electrode portion 12 can be increased and the detection sensitivity can be improved. Being at the lowest position, the center portion 12b can contact with the substrate 1.

The external electrode portion 14 is formed at a side of the main surface 1a, and can have an approximate C shape or an approximate ring shape formed at a place separated from the fixed electrode portion 11 to a radial direction and roughly surrounding the fixed electrode portion 11 when seen from a planar view (see FIG. 2). The external electrode portion 14 shown as an example in the figure has a C shape when seen from a planar view (see FIG. 2).

As shown in FIG. 1, a distance L1 of a radial direction between the external electrode portion 14 and the fixed electrode portion 11 when seen from a planar view is preferably greater than a stroke of the movable electrode portion 12 (maximum displacement distance of the movable electrode portion 12 in an upper and lower direction. For example, "h1-h2" shown in FIGS. 6 and 7).

As a result, since parasitic capacitance generated between the fixed electrode portion 11 and the external electrode portion 14 becomes small, an amount of change of the capacitance value caused by approaching the object to be detected 20 and the movable electrode portion 12 approaching the fixed electrode portion 11 becomes relatively large, and a relative amount of capacitance change between the first stage (approaching and leaving of the object to be detected) and the second stage (displacement of the movable electrode portion due to pressing) can be increased. Therefore, a detection of the amount of change is easier.

Here, parasitic capacitance refers to a value of the capacitance that is provided in a state that the object to be detected 20 does not approach the switch element 2.

The distance L1 of the radial direction between the external electrode portion 14 and the fixed electrode portion 11 when seen from a planar view is preferably 0.15-3.5 mm. By setting L1 within the range, the parasitic capacitance can be small and also the growth in size of the input device 10 can be prevented.

Additionally, the stroke "h1-h2" of the movable electrode portion 12 is preferably 0.1-0.4 mm. As a result, an amount of change of the capacitance value can be great and also the growth in size of the input device 10 can be prevented.

Furthermore, the difference between L1 and "h1-h2" is preferably 0.05-3.1 mm. As a result, an amount of change of the capacitance value caused by approaching the object to be detected 20 and the movable electrode portion 12 approaching the fixed electrode portion 11 becomes relatively great, and therefore, a detection of the amount of change is easier.

A length in a radial direction of the external electrode portion 14 (width W1 shown in FIG. 1) is preferably 0.5 mm or more. By setting the width W1 within the range, the detection sensitivity can be improved.

As shown in FIG. 2, the fixed electrode portion 11 is formed at a position which is apart from the external electrode portion 14 in the radial direction when seen from a planar view; however, the size and the formation position of the fixed electrode portion 11 are not limited to the examples shown in the figures. For example, the fixed electrode portion 11 can be formed in a wider region that a region shown in FIG. 2, and a portion thereof can be formed in a region which overlaps the external electrode portion 14 when seen from a planar view.

The press sheet 4 is a sheet body with flexibility and formed of a resin material such as PET. The press sheet 4 is flexurally deformable in a thickness direction.

At a lower surface 4a (surface of a side of the substrate 1) of the press sheet 4, a resin layer 7 is formed.

In an example shown in the figures, on the resin layer 7, an opening portion 7a having a circular form, which is slightly larger than the external electrode portion 14, when seen from a planar view is formed (see FIG. 2). Inside the opening portion 7a, the external electrode portion 14 is formed.

The exterior sheet 5 is a sheet body with flexibility and formed of a resin material such as PET. The exterior sheet 5 is flexurally deformable in a thickness direction.

As shown in FIG. 8, on the exterior sheet 5, the display portion (operation key portion) 5a on which characters, symbols, and figures are displayed can be formed. The display portion (operation key portion) 5a is preferably formed on a position which overlaps with at least part of the movable electrode portion 12 when seen from a planar view.

Next, an operation of the input device 10 is described.

As shown in FIGS. 1 and 3, while the object to be detected 20 does not approach the switch element 2, the capacitance, which is detected by applying a pulse voltage to the movable electrode portion 12 with the detection portion (pulse generation portion and capacitance detection portion) 3, is a sum $(\alpha+\gamma 1)$ of the capacitance $\gamma 1$ produced between the fixed electrode portion 11 and the movable electrode portion 12 and other parasitic capacitance $\alpha$.

$\gamma 1$ is represented by $\epsilon_1(S/h1)$. Note that $\epsilon_1$ is permittivity between the fixed electrode portion 11 and the movable electrode portion 12. In fact, an air layer and the substrate 1 each of which has different permittivity exist between the fixed electrode portion 11 and the movable electrode portion 12. Here however, in order to simplify the description, it is assumed that layers with equal permittivity are sandwiched between the fixed electrode portion 11 and the movable electrode portion 12, and the permittivity is represented by $\epsilon_1$. S is an area of the fixed electrode portion 11 that faces the movable electrode portion 12. h1 is a distance between the fixed electrode portion 11 and a portion of the movable electrode portion 12 that overlaps the fixed electrode portion 11 when seen from a planar view. For example, the distance can be a difference in height between an upper surface 11a of the fixed electrode portion 11 and a lower surface of a center portion 12b.

An area S of the fixed electrode portion 11 that faces the movable electrode portion 12 is preferably 0.5-20.0 mm². According to this size, a value of capacitance that occurs at the movable electrode portion 12 and the fixed electrode portion 11 can be greater, and thereby, an amount of change of the capacitance value when the movable electrode portion 12 is pressed can be greater.

Being widely different depending on the distance between the fixed electrode portion 11 and the movable electrode portion 12, and a configuration of the detection portion 3, capacitance γ1 is approximately 0.01-20 (pF).

The capacitance at the detection portion 3 is determined by detecting the amount of change of the capacitance when the capacitance has changed. For the detection of the capacitance, part of the circuits described in such as Japanese Unexamined Patent Application, First Publication No. 2007-18839 and Japanese Unexamined Patent Application, First Publication No. 2005-353565 can be used. As shown in FIGS. 1 and 3, a state that the object to be detected 20 does not approach the switch element 2 is referred to as "a normal state".

As shown in FIGS. 4 and 6, when the object to be detected 20 approaches the switch element 2, the capacitance detected at the detection portion 3 changes as described below.

The object to be detected 20 is for example, the fingers or a hand of the operator or a stylus pen, and at least part of the object includes an electric conductor. The movable electrode portion 12 forms capacitance β with the ground through the object to be detected 20.

In the example shown in the figures, the object to be detected 20 contacts with the upper surface of the exterior sheet 5 at a position which overlaps with the movable electrode portion 12 when seen from a planar view, and the object to be detected 20 is placed adjacent to the movable electrode portion 12. In this state, since the movable electrode portion 12 is not pressed and is not deformed, a height of the center portion 12b is the same as the height in the normal state shown in FIG. 1 and FIG. 3. The state shown in FIGS. 4 and 6 is referred to as "an approaching state".

In the approaching state, since the capacitance β is produced between the object to be detected 20 and the movable electrode portion 12, the capacitance detected by the detection portion 3 is a sum of the capacitance (α+γ1) in the normal state and the capacitance β, which is the value (α+β+γ1). In particular, the detected value increases by "β" compared with the value in the normal state.

Being widely different depending on the size of the movable electrode portion 12 and a configuration of the detection portion 3, capacitance β is approximately 1-100 (pF).

As shown in FIGS. 5 and 7, as the object to be detected 20 presses the center portion 12b of the movable electrode portion 12 in a lower direction (a direction approaching the substrate 1) through the exterior sheet 5, the movable electrode portion 12 deforms elastically and a portion including the center portion 12b (a center portion) forms a curved shape that is convex in a lower direction.

This makes the center portion 12b be displaced in a lower direction, and the distance between the center portion 12b and the fixed electrode portion 11 decreases. When the displacement occurs, the movable electrode portion 12 provides the operator with a clicking touch.

The state shown in FIG. 5 and FIG. 7 is referred to as "a pressed state".

Since the fixed electrode portion 11 is provided on a rear surface 1b of the substrate 1, the movable electrode portion 12 does not contact with the fixed electrode portion 11. Therefore, there is no chance for the movable electrode portion 12 to be electrically connected with the fixed electrode portion 11.

If the movable electrode portion 12 and the fixed electrode portion 11 are electrically connected, it is assumed that the capacitance cannot be detected. However, this does not occur in the input device 10.

In the pressed state, capacitance γ2 formed between the fixed electrode portion 11 and the movable electrode portion 12 is represented by "$\epsilon_2(S/h2)$". $\epsilon_2$ is permittivity between the fixed electrode portion 11 and the movable electrode portion 12 in the pressed state.

Since the distance between the fixed electrode portion 11 and the movable electrode portion 12 (h2 shown in FIGS. 5 and 7) becomes small, capacitance γ2 is greater compared with capacitance γ1 in "the approaching state" shown in FIGS. 4 and 6.

Therefore, capacitance (α+β+γ2) detected by the detection portion 3 is greater than capacitance (α+β+γ1) of the approaching state (see FIGS. 4 and 6).

Being widely different depending on the relative permittivity of the substrate 1 and the length of h2, capacitance γ2 is approximately 0.04-350 (pF).

The difference of capacitance in the approaching state and the pressed state is γ2−γ1. The difference is approximately 0.03-330 (pF).

When the operator stops pressing, due to elastic restoring force of the movable electrode portion 12, the movable electrode portion 12 returns to the original form (shown in FIGS. 4 and 6), and the center portion 12b is displaced in an upper direction. The detected value of capacitance is (α+β+γ1).

Leaving the switch element 2, the object to be detected 20 returns to the normal state shown in FIGS. 1 and 3, and the detected value of capacitance is again (α+γ1).

Figure 9:
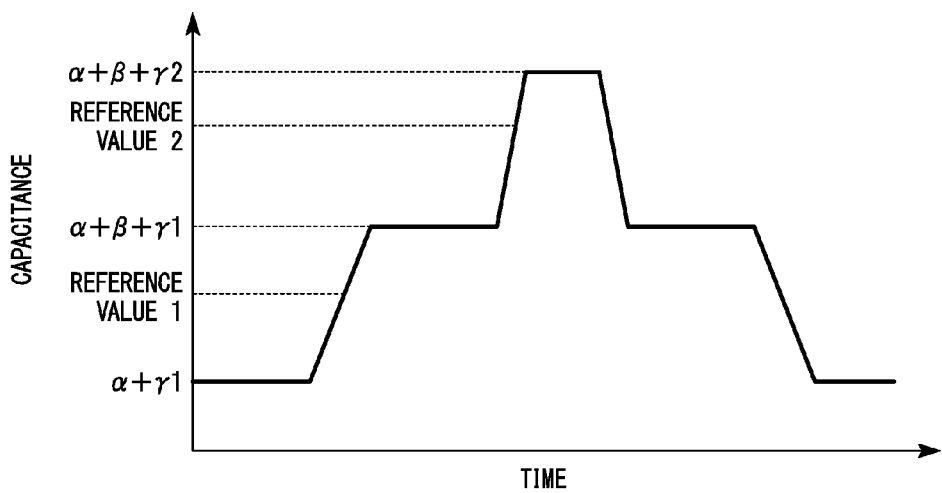
FIG. 9 is a diagram showing a capacitance change in the input device of FIG. 1.

FIG. 9 is a diagram showing the capacitance change in the series of operation. Hereinafter, with reference to the figure, an example of the detection operation in the input device 10 is described.

A reference value 1 (the first reference value) is set in advance between the capacitance (α+γ1) at the normal state and the capacitance (α+β+γ1) at the approaching state, and a reference value 2 (the second reference value) is set in advance between the capacitance (α+β+γ1) at the approaching state and the capacitance (α+β+γ2) at the pressed state.

When the state is changed from the normal state (FIG. 3) to the approaching state (FIG. 4), the capacitance detected by the detection portion 3 increases from (α+γ1) to (α+β+γ1) over the reference value 1.

Detecting the capacitance over the reference value 1, the detection portion 3 recognizes that the object to be detected 20 approaches and outputs the first detection signal, and by the first detection signal, any operations (for example, indication to a display of a display portion (not shown)) can be performed.

When the state is changed from the approaching state (FIG. 4) to the pressed state (FIG. 5), the capacitance detected by the detection portion 3 increases from $(\alpha+\beta+\gamma 1)$ to $(\alpha+\beta+\gamma 2)$ over the reference value 2.

Detecting the capacitance over the reference value 2, the detection portion 3 recognizes that the pressing operation is performed and outputs the second detection signal, and by the second detection signal, any operations (for example, indication to a display of a display portion (not shown)) can be performed.

Similarly, when the capacitance is below the reference value 2 with the transition from the pressed state to the approaching state and when the capacitance is below the reference value 1 with the transition from the approaching state to the normal state, respectively, the detection portion 3 outputs a detection signal, and thereby, any operations can be performed.

In the example, by setting two reference values in advance, the detection portion 3 recognizes approaching and leaving the object to be detected 20 and the pressing operation of the switch element 2 separately, and provides switching functions in two stages.

Note that in this example, although two reference values are set, three or more reference values can be used. For example, two or more reference values can be set respectively between $(\alpha+\gamma 1)$ and $(\alpha+\beta+\gamma 1)$ and between $(\alpha+\beta+\gamma 1)$ and $(\alpha+\beta+\gamma 2)$.

Furthermore, the reference value may include hysteresis.

Figure 10A:
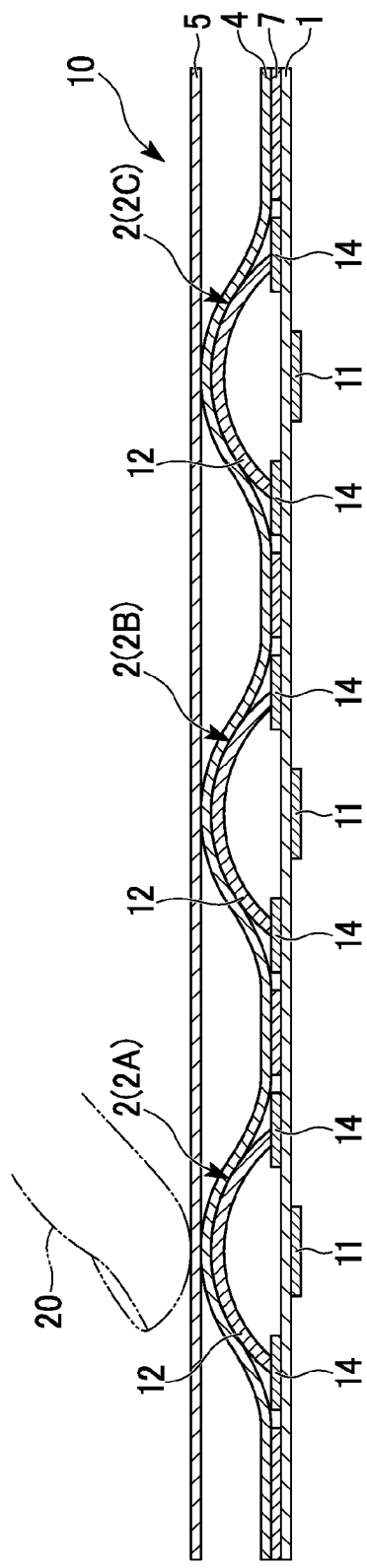
FIG. 10A is an explanatory diagram regarding position detection of the object to be detected in the input device of FIG. 1.
Figure 10B:
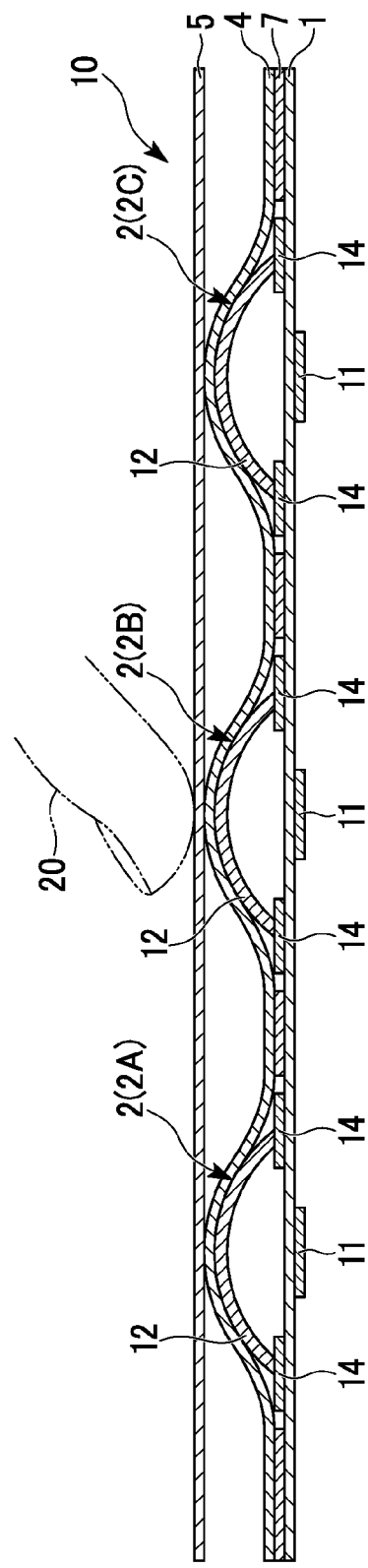
FIG. 10B is an explanatory diagram regarding position detection of the object to be detected in the input device of FIG. 1.
Figure 10C:
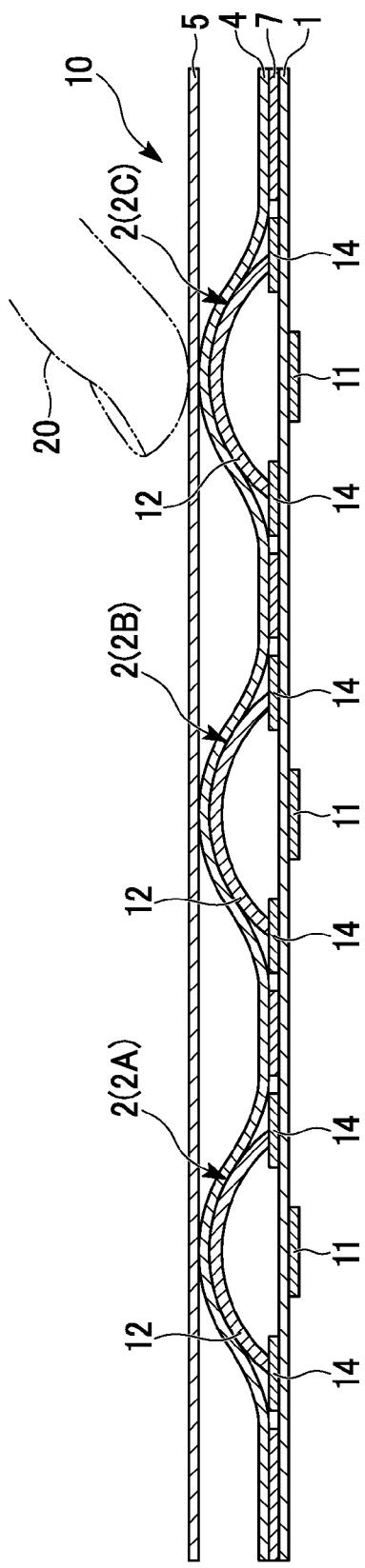
FIG. 10C is an explanatory diagram regarding position detection of the object to be detected in the input device of FIG. 1.

As shown in FIGS. 10A-10C, the input device 10 can detect a flat position (an in-plane position along the substrate 1) of the object to be detected 20.

The assumed case is that the object to be detected 20 moves to the third position (FIG. 10C) adjacent to the third switch element 2 (2C) from the first position (FIG. 10A) adjacent to the first switch element 2 (2A) via the second position (FIG. 10B) adjacent to the second switch element 2 (2B).

At the first position (FIG. 10A), since the object to be detected 20 is adjacent to the first switch element 2A, at the first switch element 2A, a detection value of the capacitance shows a high value. On the other hand, at the second and the third switch elements 2B, 2C in the normal state, a detection value of the capacitance shows a relatively small value.

At the second position (FIG. 10B), since the object to be detected 20 is adjacent to the second switch element 2B, at the second switch element 2B, a detection value of the capacitance shows a high value. On the other hand, at the first and the third switch elements 2A, 2C, a detection value of the capacitance shows a relatively small value.

At the third position (FIG. 10C), since the object to be detected 20 is adjacent to the third switch element 2C, at the third switch element 2C, a detection value of the capacitance shows a high value. On the other hand, at the first and the second switch elements 2A, 2B, a detection value of the capacitance shows a small value.

As described above, depending on the position of the object to be detected 20, a detection value of capacitance at each switch element 2 changes. Therefore, based on the detection value, it is possible to identify the position of the object to be detected 20.

In order to manufacture the input device 10, the resin layer 7 is provided on the main surface 1a of the substrate 1 on which the fixed electrode portion 11, the external electrode portion 14, and the movable electrode portion 12 are formed. Additionally, the press sheet 4 is formed thereon, and the exterior sheet 5 is further formed on the press sheet 4.

Thereby, the input device 10 such as shown in FIG. 1 is obtained.

In the input device 10, with a single detection portion 3, it is possible to detect a capacitance change due to a position change of the object to be detected 20, and also to detect a capacitance change when the movable electrode portion 12 is displaced due to a pressing operation. As a result, a circuit for detecting a position of the object to be detected 20 and a circuit for detecting a pressing operation of the movable electrode portion 12 can be a common circuit, and thereby, a circuit configuration inside the device can be simplified. Therefore, it is advantageous for such as reducing costs, ease of manufacture, and downsizing the device.

In the input device 10, the pressing operation of the movable electrode portion 12 is detected by the capacitance change. Therefore, compared to a configuration that detects the pressing operation by the electrical connection of the electrode portion, a current flowing in the circuit at the time of the detection does not increase rapidly, and failures caused by the rapid increase of the current do not occur.

Additionally, unlike the configuration that detects the pressing operation by the electrical connection of the electrode portion, the contact failure does not occur that is caused by foreign substance contamination, corrosion of the electrode portion and the like.

Therefore, the detection sensitivity is not decreased.

In the input device 10, since the fixed electrode portion 11 is provided on the rear surface 1b of the substrate 1, the fixed electrode portion 11 and the movable electrode portion 12 can be reliably insulated. Therefore, there is no chance not to be able to detect the capacitance due to the electrical connection between both of the electrodes 11 and 12.

The technical scope of the present invention is not limited to the above-mentioned embodiments, and various modifications can be made within a scope that does not depart from the gist of the present invention.

Figure 11:
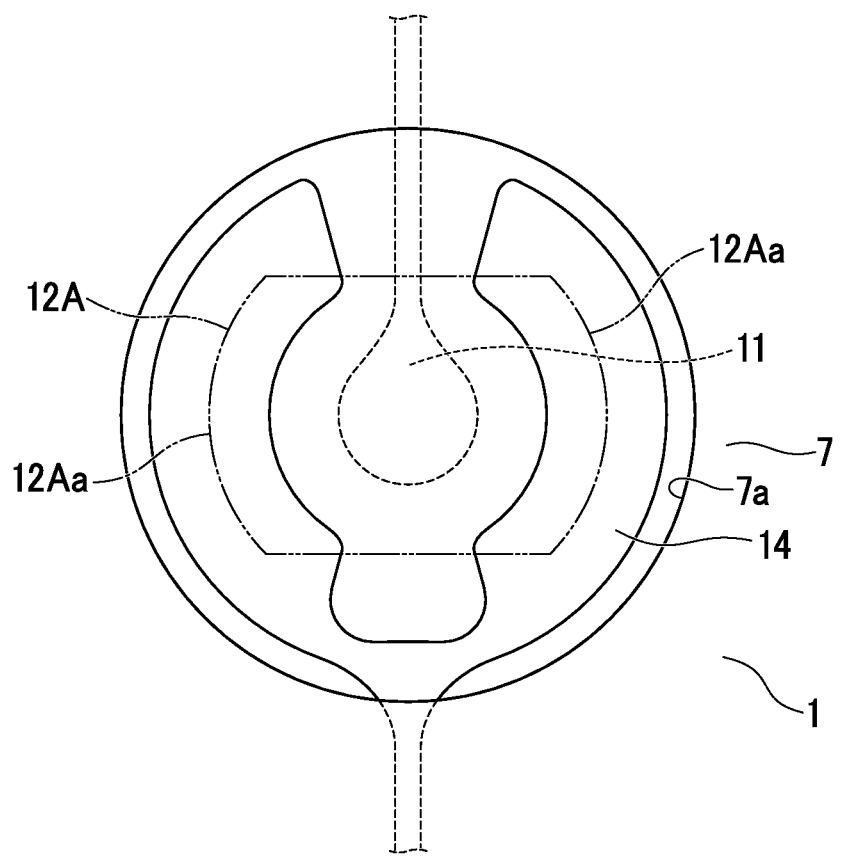
FIG. 11 is a plane diagram showing an input device including another example of a movable electrode portion.

The shape of the movable electrode portion 12 is not limited to those shown in the figures. For example, as shown in FIG. 11, the movable electrode portion 12 may have an arch shape that is constituted by a plate with a constant width extending from side to side when seen from a planar view and both base end portions 12Aa are formed on the external electrode portion 14.

In addition, in an example shown in the figures, the input device 10 includes a plurality of switch elements 2; however, the number of the switch element 2 can be one.

Figure 12:
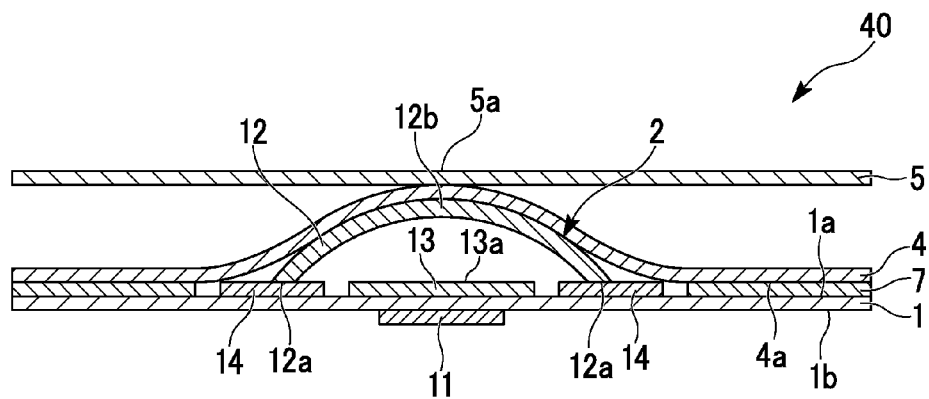
FIG. 12 is a cross-sectional diagram showing an input device of the second exemplary embodiment of the present invention.
Figure 13:
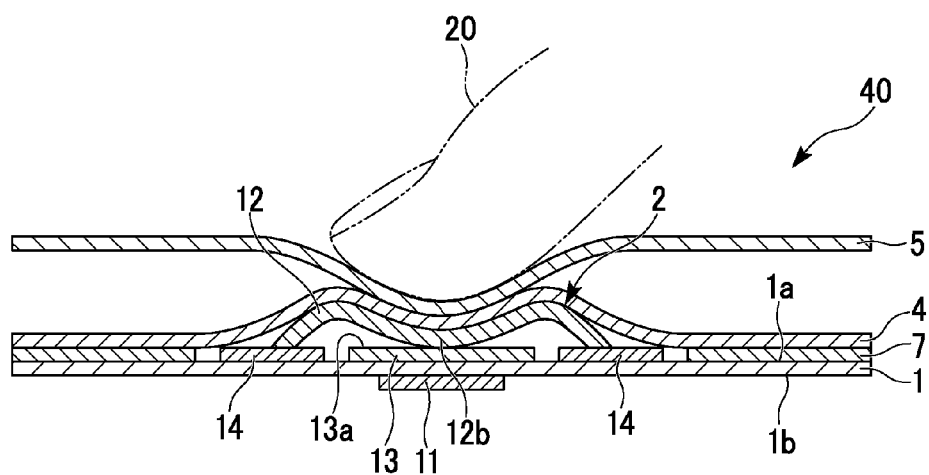
FIG. 13 is cross-sectional diagram showing a state that in the input device of FIG. 12, the object to be detected presses the movable electrode portion.
Figure 14:
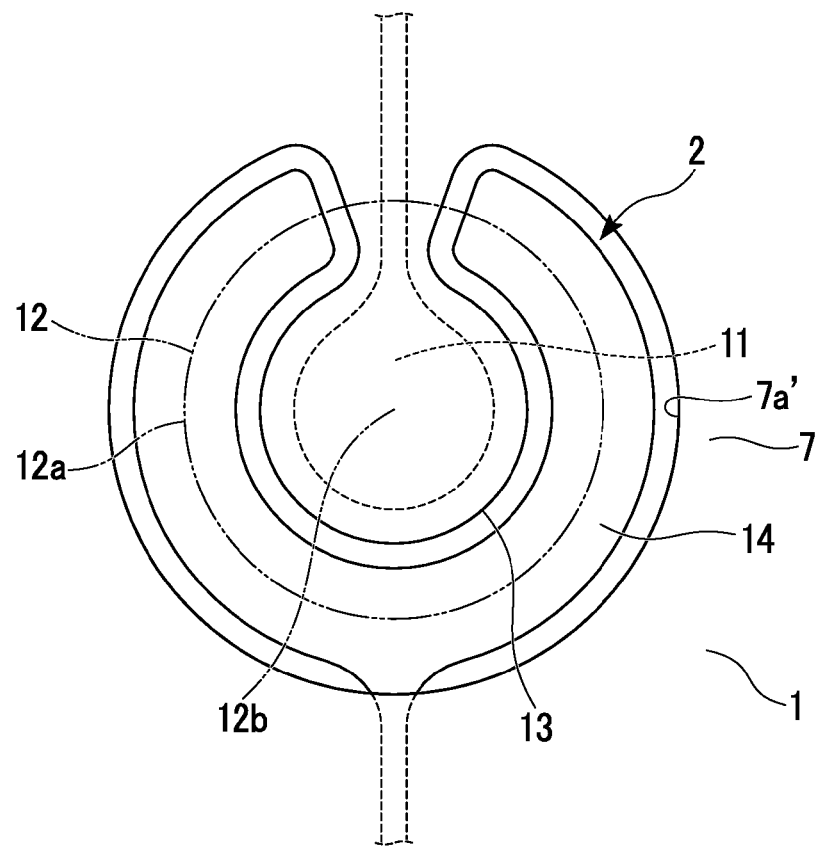
FIG. 14 is a plane diagram showing an input device of FIG. 12.

FIG. 12 is a cross-sectional diagram showing an input device 40 of the second exemplary embodiment of the present invention. FIG. 13 is a cross-sectional diagram showing an example of the input device 40 in a pressed state. FIG. 14 is a plane diagram showing the input device 40.

As shown in FIG. 12, in the input device 40, a height adjustment layer (a height adjustment unit) 13 which regulates a shift of the movable electrode portion 12 toward a direction approaching the substrate 1 is formed at the main surface 1a of the substrate 1, which is different from the input device 10 of the first exemplary embodiment shown in FIG. 1 and the like.

As shown in FIG. 13, regarding a height position of the movable electrode portion 12 (center portion 12b) when the center portion 12b is displaced in a direction approaching the fixed electrode portion 11 (lower direction), if the height position is too high, a clicking touch is insufficient since a displacement amount of the movable electrode portion 12 becomes small. If the height position is too low, it can influence durability of the movable electrode portion 12.

The height adjustment layer 13 regulates the transfer of the movable electrode portion 12 (center portion 12b) in the lower direction when the center portion 12b is displaced in a direction approaching the fixed electrode portion 11 (lower direction), and adjusts a height position of the center portion 12b. The height adjustment layer 13 regulates the further transfer in the lower direction of the center portion 12b which contacts with the upper surface 13a; therefore, a limit position of the transfer in the lower direction of the center portion 12b is defined.

The height adjustment layer 13 has a layer form along the main surface 1a. Materials which constitute the height adjustment layer 13 may be conductive materials if they do not electrically connected to the detection portion 3 and the like. However, if insulation materials are used, the capacitance between the fixed electrode portion 11 and the movable electrode portion 12 can be increased, and the detection sensitivity can be improved.

As materials which constitute the height adjustment layer 13, for example, one resin or two or more resins selected from a group of a polyimide resin, polyethylene terephthalate (PET), a polyester resin, liquid crystal polymer, an acrylic resin, a urethane resin, and an epoxide resin can be used. As the height adjustment layer 13, a commonly used solder resist may be used.

Relative permittivity of the height adjustment layer 13 can be, for example, 1.5 to 10 (F/m). By setting the relative permittivity within the range, the capacitance between the fixed electrode portion 11 and the movable electrode portion 12 can be increased and the detection sensitivity can be improved.

The thickness of the height adjustment layer 13 (dimension of a thickness direction of the substrate 1) can be, for example, 10-200 μm. By setting the thickness of the height adjustment layer 13 within the range, a clicking touch becomes favorable and deterioration of durability of the movable electrode portion 12 can be prevented.

It is preferable that the thickness of the height adjustment layer 13 is approximately the same as the thickness of the external electrode portion 14.

As shown in FIG. 14, a position seen from a planar view of the height adjustment layer 13 is a position where the center portion 12b being displaced can be contacted. The height adjustment layer 13 is preferably formed so as to include a position which overlaps at least the center portion 12b when seen from a planar view.

A shape of the height adjustment layer (height adjustment unit) 13 is not limited to a layer form if the height of the center portion 12b is adjustable and may have other shapes. For example, the shape of the height adjustment layer 13 may be a shape of one or a plurality of blocks formed on the main surface 1a.

The height adjustment layer 13 may be formed separately from the resin layer 7; however, may be integrally formed with the resin layer 7. In an example shown in FIG. 13, on the resin layer 7, an opening portion 7a' having a C shape, which is slightly larger than the external electrode portion 14, when seen from a planar view is formed. An approximately circular section inside the opening portion 7a' is the height adjustment layer 13.

Figure 15:
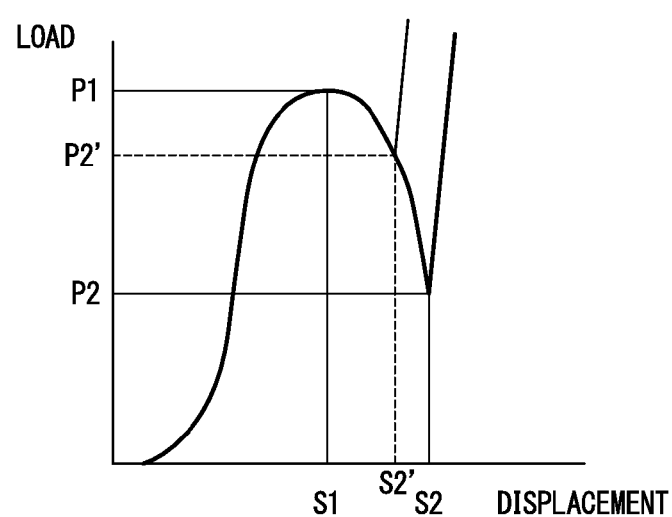
FIG. 15 is a diagram showing a relationship between a load added to the movable electrode portion during the pressing operation and a displacement amount of the movable electrode portion.

FIG. 15 is a diagram showing a relationship between a load added to the movable electrode portion 12 during the pressing operation (see the vertical axis) and a displacement amount of the center portion 12b (see the lateral axis). The displacement amount is a transfer distance of the center portion 12b (a distance in an upper and lower direction in FIGS. 12 and 13) during the pressing operation based on a normal state (see FIG. 12).

S1 is a displacement amount when a center portion of the movable electrode portion 12 is inverted, and a load at the moment has a local maximum value of P1. S2 is a displacement amount when the inversion has been completed, and a load at the moment has a local minimum value of P2.

When the thickness dimension of the height adjustment layer 13 is too large and a displacement amount when the center portion 12b contacts the height adjustment layer 13 becomes S2' which is smaller than S2, the load becomes P2' which is greater than the local minimum value of P2. Therefore, a clicking touch is slightly deteriorated.

In contrast, when the thickness dimension of the height adjustment layer 13 is set so that the displacement amount of the center portion 12b when the center portion 12b contacts the height adjustment layer 13 is S2, the load becomes the local minimum value of P2 and the load change during the pressing operation increases. Therefore, a clicking touch becomes favorable.

In the input device 40, by providing the height adjustment layer 13, a sufficient clicking touch can be obtained, and deterioration of durability of the movable electrode portion 12 can be prevented.

Figure 16:
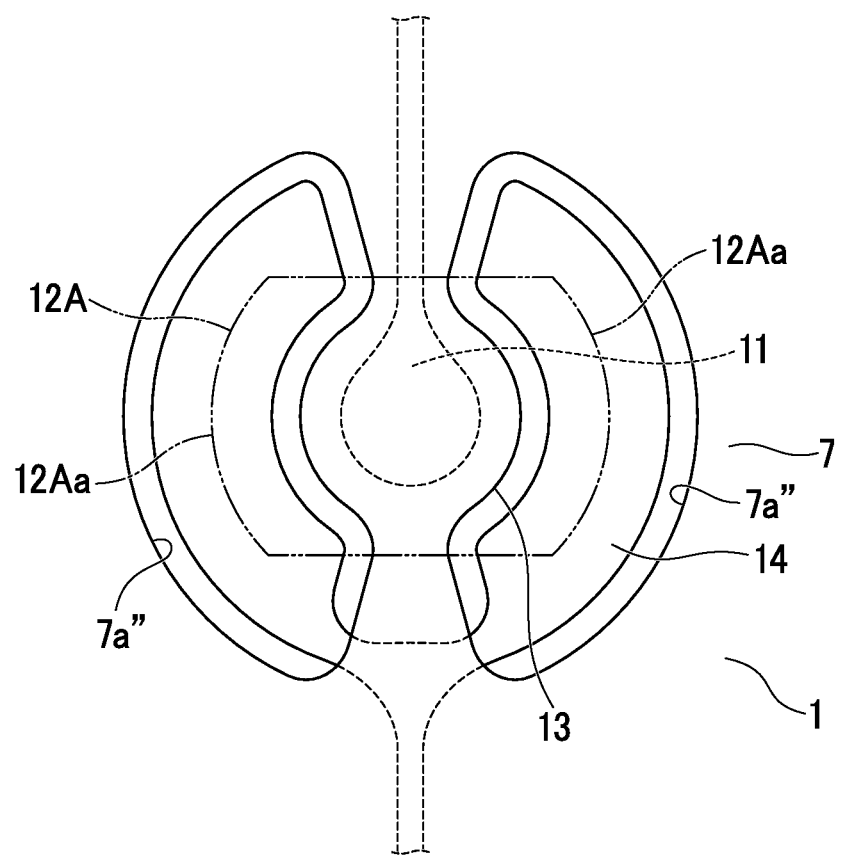
FIG. 16 is a plane diagram showing an input device including another example of a movable electrode portion.

The shape of the movable electrode portion 12 is not limited to those shown in the figures. For example, as shown in FIG. 16, the movable electrode portion 12 may have an arch shape that is constituted by a plate with a constant width extending from side to side when seen from a planar view and both base end portions 12Aa are formed on the external electrode portion 14.

In this example, an opening portion 7a" of the resin layer 7 has a fan shape corresponding to a shape that is made by dividing the opening portion 7a', which has a C shape when seen from a planar view as shown in FIG. 14, at a center in a longitudinal direction.

Figure 17:
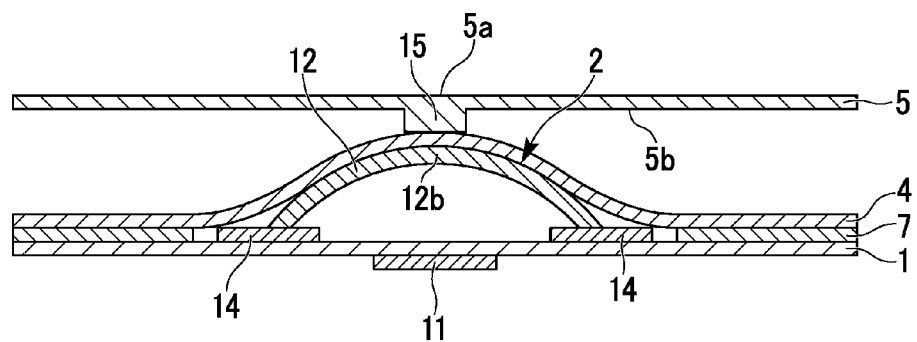
FIG. 17 is a cross-sectional diagram showing an example of an input device using an exterior sheet having protruding portions.

As shown in FIG. 17, on a lower surface 5b of the exterior sheet 5, a protruded portion 15 (a pressure transmission portion) can be formed.

The protruded portion 15 is a thick portion having a circular shape, a polygonal shape, and the like when seen from a planar view, and formed by protruding from the lower surface 5b toward a lower direction. The position where the protruded portion 15 is formed preferably includes a position which overlaps with the center portion 12b of the movable electrode portion 12 when seen from a planar view.

In the input device, when the operator presses the exterior sheet 5, the protruded portion 15 is displaced in a downward direction and presses the center portion 12b of the movable electrode portion 12 through the press sheet 4. Since the pressure concentrates and acts at the movable electrode portion 12 through the protruded portion 15, the pressure can efficiently act at the movable electrode portion 12. This improves the reliability of the operation and ensures a favorable clicking touch.

Additionally, even when a position pressed by the operator seen from a planar view is apart from the center of the movable electrode portion 12, the pressure is transmitted to a proper position of the movable electrode portion 12 through the protruded portion 15; thereby an erroneous operation can be prevented.

Figure 18:
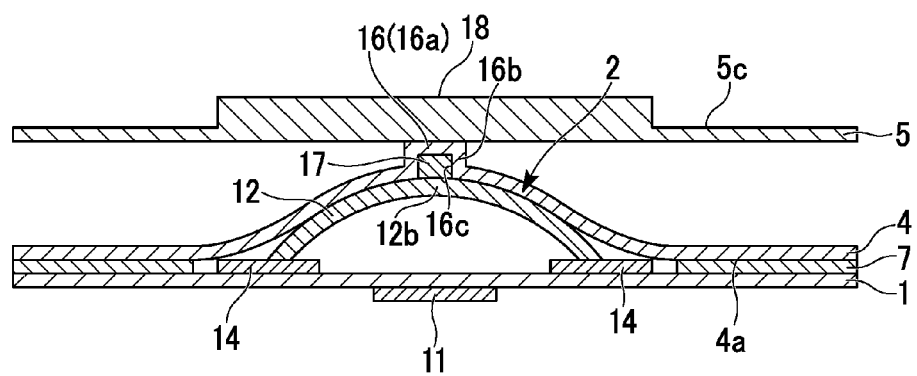
FIG. 18 is a cross-sectional diagram showing an example of an input device using a pressure transmission member.

FIG. 18 is a cross-sectional diagram showing an example of an input device using a pressure transmission member, and in the input device, the press sheet 4 has a projected portion 16 that is projected in an upper direction. An example of the projected portion 16 shown in the figure includes an upper plate 16a and a side plate 16b drooping from a periphery of the upper plate 16a. A shape of the projected portion 16 seen from a planar view may be a circular shape, a polygonal shape, and the like.

An inner surface side of the projected portion 16 (a lower surface side) is a concave housing portion 16c, and the pressure transmission member 17 is accommodated inside the concave housing portion 16c. Since the pressure transmission member 17 is accommodated in the concave housing portion 16c of the press sheet 4, the pressure transmission member 17 is less likely to shift laterally.

The pressure transmission member 17 can be a shape that fits the inner shape of the concave housing portion 16c, for example, a block shape such as a column, a cuboid and the like. The position where the pressure transmission member 17 is formed preferably includes a position which overlaps with the center portion 12b of the movable electrode portion 12 when seen from a planar view.

In the input device, since the pressure transmission member 17 is placed between the upper surface of the movable electrode portion 12 and the press sheet 4, the pressure from the operator concentrates and acts at the movable electrode portion 12 through the pressure transmission member 17. Therefore, the pressure can efficiently act at the movable electrode portion 12. This improves the reliability of the operation and ensures a favorable clicking touch.

Additionally, even when a position pressed by the operator seen from a planar view is apart from the center of the movable electrode portion 12, the pressure is transmitted to a proper position of the movable electrode portion 12 through the pressure transmission member 17; thereby an erroneous operation can be prevented.

On an upper surface 5c of the exterior sheet 5, a convex portion for operation 18 can be formed. The convex portion for operation 18 is a thick portion having a circular shape, a polygonal shape, and the like when seen from a planar view. The position where the convex portion for operation 18 is formed preferably includes a position which overlaps with the center portion 12b of the movable electrode portion 12 when seen from a planar view.

By the convex portion for operation 18, the pressure from the operator is more reliably transmitted to the movable electrode portion 12.

Figure 19:
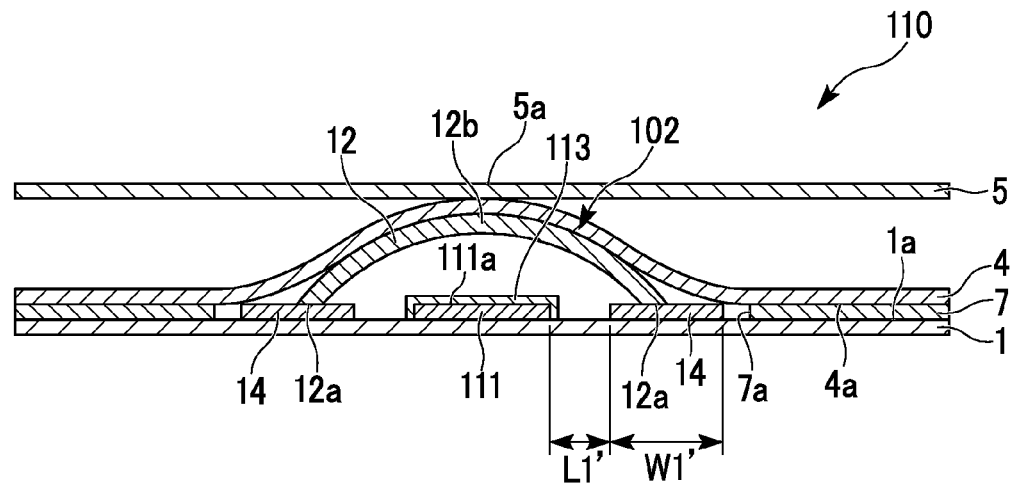
FIG. 19 is a cross-sectional diagram showing an input device of the third exemplary embodiment of the present invention.
Figure 20:
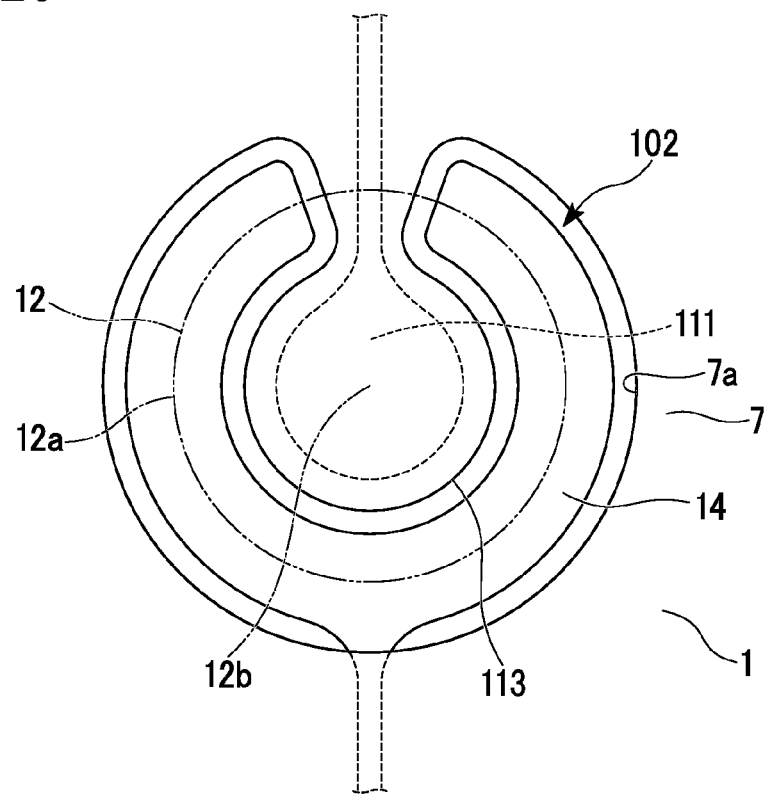
FIG. 20 is a plane diagram showing the input device of FIG. 19.
Figure 21:
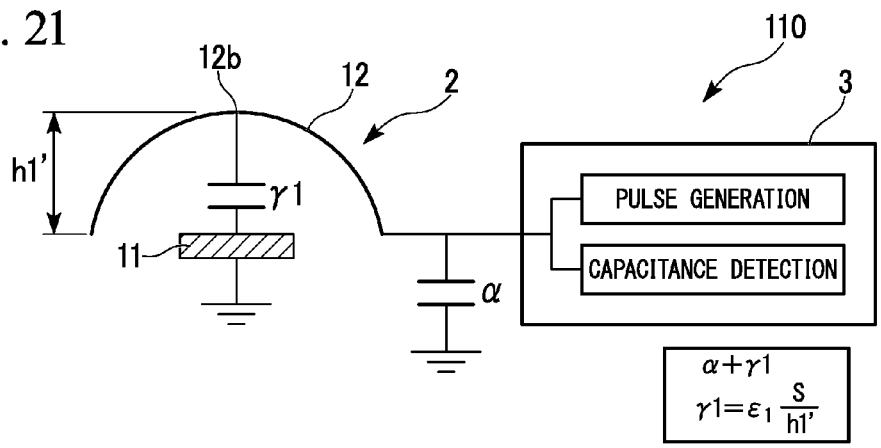
FIG. 21 is a structural diagram schematically showing the input device of FIG. 19.
Figure 22:
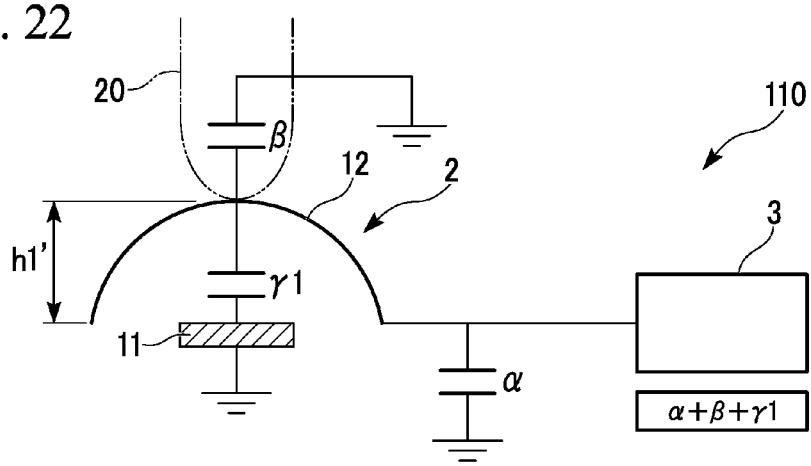
FIG. 22 is a structural diagram schematically showing a state that in the input device of FIG. 19, the object to be detected approaches a movable electrode portion.
Figure 23:
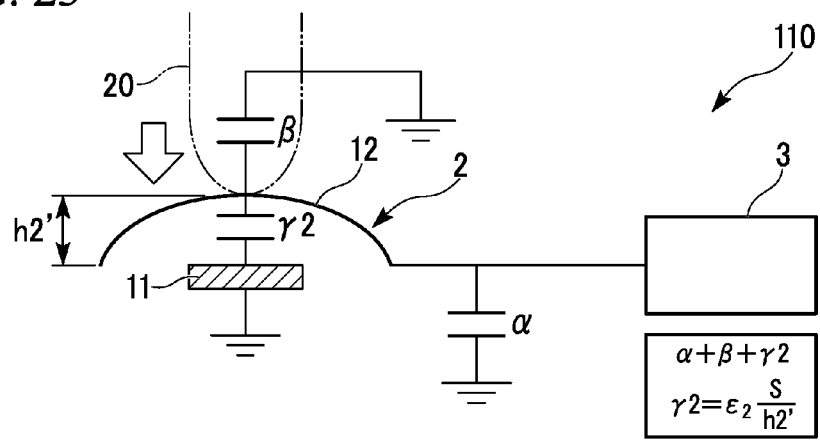
FIG. 23 is a structural diagram schematically showing a state that in the input device of FIG. 19, the object to be detected presses the movable electrode portion.
Figure 24:
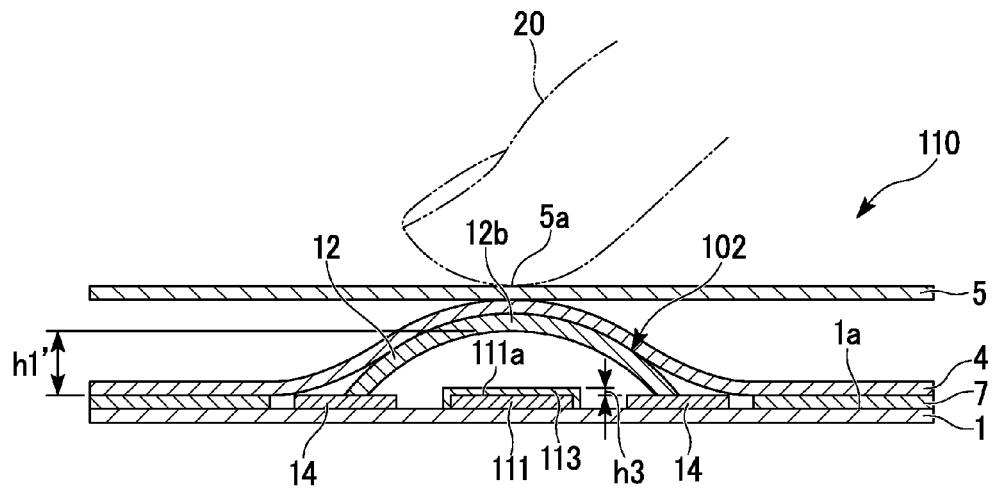
FIG. 24 is a cross-sectional diagram showing a state that in the input device of FIG. 19, the object to be detected approaches a movable electrode portion.
Figure 25:
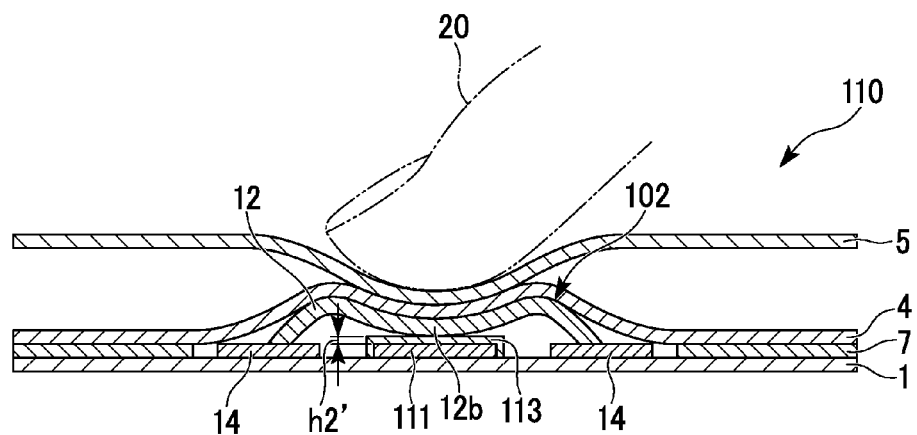
FIG. 25 is a cross-sectional diagram showing a state that in the input device of FIG. 19, the object to be detected presses the movable electrode portion.
Figure 26:
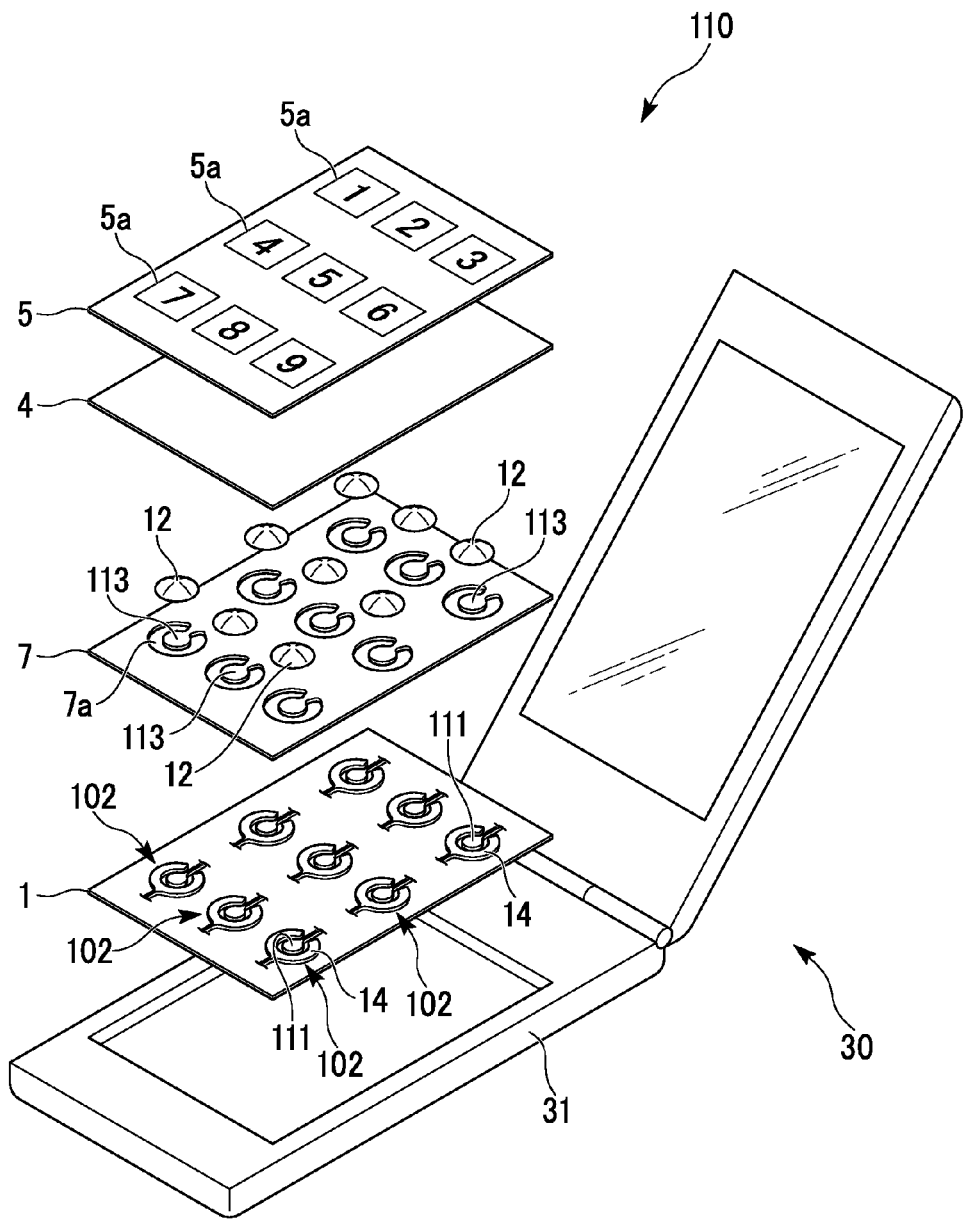
FIG. 26 is a perspective diagram showing an example of an electronic device using the input device of FIG. 19.

FIG. 19 is a cross-sectional diagram showing an input device (input device module) 110 of the third exemplary embodiment of the present invention. FIG. 20 is a plane diagram showing the input device 110. FIG. 21 is a structural diagram schematically showing the input device 110. FIG. 22 is a structural diagram schematically showing a state that the object to be detected 20 approaches the movable electrode portion 12. FIG. 23 is a structural diagram schematically showing a state that the object to be detected 20 presses the movable electrode portion 12. FIG. 24 is a cross-sectional diagram showing a state that the object to be detected 20 approaches the movable electrode portion 12. FIG. 25 is a cross-sectional diagram showing a state that the object to be detected 20 presses the movable electrode portion 12. FIG. 26 is a perspective diagram showing an example of an electronic device using the input device 110.

In the descriptions below, regarding the same structure as the input device shown in the first exemplary embodiment and the second exemplary embodiment, the same reference symbols are referred to and the detailed descriptions are omitted. A height direction refers to an upper direction (a direction perpendicular to and apart from the substrate 1) in FIG. 19.

FIG. 26 shows an example of a mobile phone using an input device 110. The input device 110 is provided on a main body 31 of a mobile phone 30.

As shown in FIGS. 19-21, the input device 110 includes a substrate 1, a switch element 102 provided on a main surface 1a of the substrate 1, a detection portion 3 that detects a capacitance change at the switch element 102, a press sheet 4 that covers the switch element 102, and an exterior sheet 5 that covers the press sheet 4.

As the substrate 1, insulation materials such as polyimide, polyethylene terephthalate (PET), polyester resin, aramid resin, liquid crystal polymer, glass, and the like can be used. For example, a printed wiring substrate such as a flexible printed circuit (FPC) and a printed circuit board (PCB) can be used.

On the main surface 1a, a wiring layer (not shown) formed of an electric conductive material such as silver, copper, and the like can be formed, and through the wiring layer, each electrode portion and the detection portion 3 can be electrically connected.

The switch element 102 includes a fixed electrode portion 111 provided on the main surface 1a, a movable electrode portion 12 where at least part of thereof is provided on a position which overlaps with the fixed electrode portion 111 when seen from a planar view, an insulation layer (insulation portion) 113 which is formed so as to cover at least part of the fixed electrode portion 111, and an external electrode portion 14 provided on the main surface 1a.

The fixed electrode portion 111 is a conductive portion that is formed of an electric conductive material such as silver, copper, and the like, and shape thereof when seen from a planar view can be an approximate circular form (see FIG. 20).

The fixed electrode portion 111 is connected to ground. Therefore, at the fixed electrode portion 111, the potential becomes constant.

Therefore, a capacitance change between the movable electrode portion 12 and the fixed electrode portion 111 due to potential vibration of the fixed electrode portion 111 can be avoided, and the capacitance detection with two stages can be precisely performed.

In addition, since the potential at the fixed electrode portion 111 is constant, there is no noise influence. Moreover, it is possible to prevent the noise from reaching the movable electrode portion 12 by absorbing the noise at the fixed electrode portion 111.

Therefore, the detection of the capacitance change with two stages can be performed with high accuracy.

The movable electrode portion 12 is a plate-like body (metal plate) formed of an electric conductive material such as metals, and can have a domical shape which is protruded so as to form a convex shape toward an upper direction (a direction leaving the substrate 1).

A cross-sectional shape of the movable electrode portion 12 has, for example, a curved shape, and in an example shown in FIG. 19, has an approximate elliptical arc shape. Here, the movable electrode portion 12 is not limited to have a curved shape, but may have a flat shape or a bent shape.

A shape of the movable electrode portion 12 seen from the planar view can be an approximate circular form (see FIG. 20). A base end portion 12a of the movable electrode portion 12 (a peripheral portion of the movable electrode portion 12) is fixed on an upper surface of the external electrode portion 14, and electrically connected to the external electrode portion 14.

The movable electrode portion 12 shown in the figures as an example has an outer diameter which is larger than that of the fixed electrode portion 111 and covers the fixed electrode portion 111.

The movable electrode portion 12 can be formed of metal materials such as stainless steel.

The movable electrode portion 12 has elastically displaceable flexibility in a direction where the center portion 12b approaches and leaves the fixed electrode portion 111 by pressure from an operator. The state of the movable electrode portion 12 is switchable between an undeformed state as shown in FIG. 24 and a state in which the center portion 12b approaches the fixed electrode portion 111 with a center section of the center portion 12b being protruded toward a lower direction as shown in FIG. 25 (a pressed state).

The external electrode portion 14 is formed at a side of the main surface 1a, and can have an approximate C shape or an approximate ring shape formed at a place separated from the fixed electrode portion 111 to a radial direction and roughly surrounding the fixed electrode portion 111 when seen from a planar view. The external electrode portion 14 in an example shown in the figure has a C shape when seen from a planar view (see FIG. 20).

As shown in FIG. 19, a distance L1' of a radial direction between the external electrode portion 14 and the fixed electrode portion 111 when seen from a planar view is preferably greater than a stroke of the movable electrode portion 12 (a maximum displacement distance of the movable electrode portion 12 in an upper and lower direction. For example, "h1'-h2'" shown in FIGS. 24 and 25).

As a result, since parasitic capacitance generated between the fixed electrode portion 111 and the external electrode portion 14 becomes small, an amount of change of the capacitance value caused by approaching the object to be detected 20 and the movable electrode portion 12 approaching the fixed electrode portion 111 becomes relatively large, and a relative amount of capacitance change between the first stage (approaching and leaving of the object to be detected) and the second stage (displacement of the movable electrode portion due to pressing) can be increased. Therefore, a detection of the amount of change is easier.

Here, parasitic capacitance refers to a value of the capacitance that is provided in a state that the object to be detected 20 does not approach the switch element 102.

The distance L1' of the radial direction between the external electrode portion 14 and the fixed electrode portion 111 when seen from a planar view is preferably 0.15-3.5 mm. By setting L1' within the range, the parasitic capacitance can be small and also the growth in size of the input device 110 can be prevented.

Additionally, the stroke "h1'-h2'" of the movable electrode portion 12 is preferably 0.1-0.4 mm. As a result, an amount of change of the capacitance value can be great and also the growth in size of the input device 110 can be prevented.

Furthermore, the difference between L1 and "h1'-h2'" is preferably 0.05-3.1 mm. As a result, an amount of change of the capacitance value caused by approaching the object to be detected 20 and the movable electrode portion 12 approaching the fixed electrode portion 111 becomes relatively large, and therefore, a detection of the amount of change is easier.

A length in a radial direction of the external electrode portion 14 (the width W1' shown in FIG. 19) is preferably 0.5 mm or more. By setting the width W1' within the range, the detection sensitivity can be improved.

The press sheet 4 is a sheet body with flexibility and formed of a resin material such as PET. The press sheet 4 is flexurally deformable in a thickness direction.

At a lower surface 4a (surface of a side of the substrate 1) of the press sheet 4, a resin layer 7 is formed.

The insulation layer 113 is formed at least on an upper surface 111a of the fixed electrode portion 111 (surface of a side of the movable electrode portion 12).

As a constituent material of the insulation layer 113, for example, one or more resins selected from a group of an acrylic resin, a urethane resin, a polyester resin, a polyimide resin, and an epoxide resin can be used. As the insulation layer 113, a commonly used solder resist may be used. The insulation layer 113 can be formed by printing or bonding an insulation material having a sheet shape with the fixed electrode portion 11.

The relative permittivity of the insulation layer 113 can be 1.5-10, for example. By setting the relative permittivity within the range, the capacitance between the fixed electrode portion 111 and the movable electrode portion 12 can be great and the detection sensitivity can be improved.

The thickness of the insulation layer 113 (a length of a thickness direction of the substrate 1) can be, for example, 5 μm or more. This enables the reliable insulation. Preferably, the thickness of the insulation layer 113 can be 5-150 μm. By setting the thickness of the insulation layer 113 within the range, the insulation is ensured, the capacitance between the fixed electrode portion 111 and the movable electrode portion 12 can be large, and the detection sensitivity can be improved.

When the movable electrode portion 12 is displaced toward a direction approaching the fixed electrode portion 111, the insulation layer 113 contacts with the fixed electrode portion 111, and thereby the fixed electrode portion 111 is prevented from being electrically connected.

As shown in FIG. 24, if a difference in height h3, which is a height difference between an upper surface of the insulation layer 113 and an upper surface of the external electrode portion 14, is smaller, a stroke of the movable electrode portion 12 can be greater. Therefore, a favorable clicking touch can be obtained. The difference in height h3 is for example, 0 or more, and is within a range of less than or equal to one-tenth of a difference in height h1'. The difference in height h3 is preferably 0.

Figure 32:
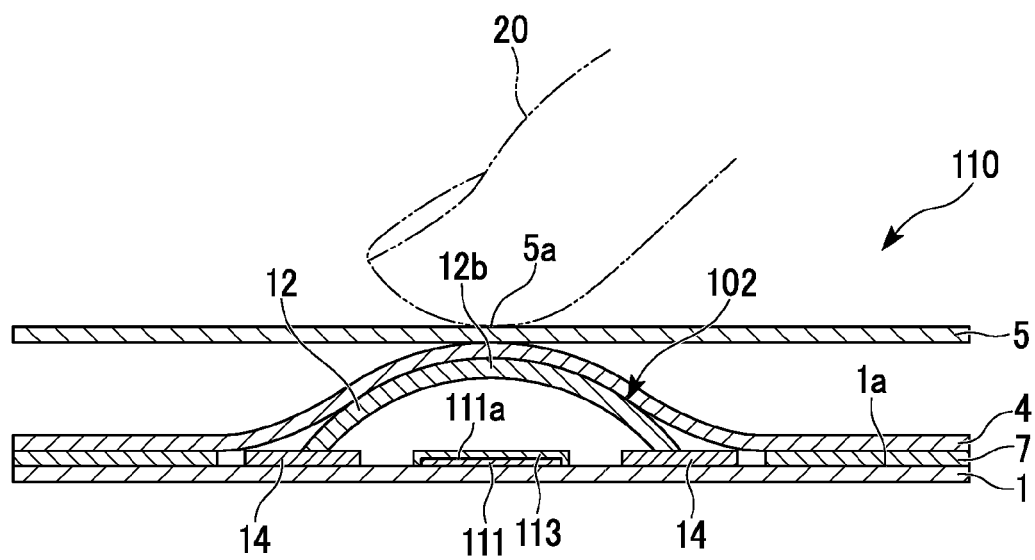
FIG. 32 is a cross-sectional diagram showing another example of an input device.

FIG. 32 shows an example where the difference in height h3 is preferably 0, i.e., an example where the upper surface of the insulation layer 113 and the upper surface of the external electrode portion 14 have the same height. In this example, the fixed electrode portion 111 is formed to be thinner than the external electrode portion 14, thereby, a position in height of the upper surface of the insulation layer 113 is adjusted, and the position in height of the upper surface of the insulation layer 113 and a position in height of the upper surface of the external electrode portion 14 become the same.

Here, the difference in height h3 has a value that height dimension of the upper surface of the external electrode portion 14 is subtracted from height dimension of the upper surface of the insulation layer 113 based on the main surface 1a of the substrate 1.

The insulation layer 113 shown in FIG. 19 and the like has an approximately constant thickness and a shape that covers the entire fixed electrode portion 111 including end surfaces of the portion 111. However, the insulation layer 113 may be formed only on the upper surface 111a of the fixed electrode portion 111.

The insulation layer 113 may be formed on the entire region of the upper surface 111a; however, may be formed only on part of the region of the upper surface 111a if the electrical connection of the movable electrode portion 12 and the fixed electrode portion 111 can be prevented.

A shape of the insulation layer (insulation portion) 113 is not limited to a layer form if the electrical connection between the movable electrode portion 12 and the fixed electrode portion 111 can be prevented, and may have other shapes. For example, the shape of the insulation layer 113 may be a shape of one or a plurality of blocks formed on the upper surface 111a of the fixed electrode portion 111.

The insulation layer 113 may be formed separately from the resin layer 7; however, may be integrally formed with the resin layer 7. In an example shown in the figures, on the resin layer 7, an opening portion 7a having a C shape, which is slightly larger than the external electrode portion 14, when seen from a planar view is formed (see FIG. 20). An approximately circular section inside the opening portion 7a is the insulation layer 113.

The exterior sheet 5 is a sheet body with flexibility and formed of a resin material such as PET. The exterior sheet 5 is flexurally deformable in a thickness.

As shown in FIG. 26, on the exterior sheet 5, the display portion (operation key portion) 5a on which characters, symbols, and figures are displayed can be formed. The display portion (operation key portion) 5a is preferably formed on a position which overlaps with at least part of the movable electrode portion 12 when seen from a planar view.

Next, an operation of the input device 110 is described.

As shown in FIGS. 19 and 21, while the object to be detected 20 does not approach the switch element 102, the capacitance (parasitic capacitance), which is detected by applying a voltage to the movable electrode portion 12 with the detection portion 3 (a pulse generation portion and a capacitance detection portion), is a sum ($\alpha+\gamma1$) of the capacitance $\gamma1$ produced between the fixed electrode portion 111 and the movable electrode portion 12 and other parasitic capacitance $\alpha$.

$\gamma1$ is represented by $\epsilon_1(S/h1')$. Note that $\epsilon_1$ is permittivity between the fixed electrode portion 111 and the movable electrode portion 12. In fact, an air layer and the insulation layer 113 each of which has different permittivity exist between the fixed electrode portion 111 and the movable electrode portion 12. Here however, in order to simplify the description, it is assumed that layers with equal permittivity are sandwiched between the fixed electrode portion 111 and the movable electrode portion 12, and the permittivity is represented by $\epsilon_1$. S is an area of the fixed electrode portion 111 that faces the movable electrode portion 12. h1' is a distance between the fixed electrode portion 111 and the movable electrode portion 12 that faces thereof. For example, the distance can be a difference in height between an upper surface 111a of the fixed electrode portion 111 and a lower surface of a center portion 12b.

An area S of the fixed electrode portion 111 that faces the movable electrode portion 12 is preferably 0.5-20.0 mm². According to this size, a value of capacitance that occurs at the movable electrode portion 12 and the fixed electrode portion 111 can be greater, and thereby, an amount of change of the capacitance value when the movable electrode portion 12 is pressed can be greater.

Being widely different depending on the distance between the fixed electrode portion 111 and the movable electrode portion 12, and a configuration of the detection portion 3, capacitance $\gamma1$ is approximately 0.01-20 (pF).

The capacitance at the detection portion 3 is determined by detecting the amount of change of the capacitance when the capacitance has changed. For the detection of the capacitance, part of the circuits described in such as Japanese Unexamined Patent Application, First Publication No. 2007-18839 and Japanese Unexamined Patent Application, First Publication No. 2005-353565 can be used.

As shown in FIGS. 19 and 21, a state that the object to be detected 20 does not approach the switch element 102 is referred to as "a normal state".

As shown in FIGS. 22 and 24, when the object to be detected 20 approaches the switch element 102, the capacitance detected at the detection portion 3 changes as described below.

The object to be detected 20 is for example, the fingers or a hand of the operator or a stylus pen, and at least part of the object includes an electric conductor. The movable electrode portion 12 forms capacitance $\beta$ with the ground through the object to be detected 20.

In the example shown in the figures, the object to be detected 20 contacts with the upper surface of the exterior sheet 5 at a position which overlaps with the movable electrode portion 12 when seen from a planar view, and the object to be detected 20 is placed adjacent to the movable electrode portion 12. In this state, since the movable electrode portion 12 is not pressed and is not deformed, a height of the center portion 12b is the same as the height in the normal state shown in FIG. 19 and FIG. 21.

The state shown in FIGS. 22 and 24 is referred to as "an approaching state".

In the approaching state, since the capacitance $\beta$ is produced between the ground and the movable electrode portion 12, the capacitance detected by the detection portion 3 is a sum of the capacitance ($\alpha+\gamma1$) in the normal state and the capacitance $\beta$, which is the value ($\alpha+\beta+\gamma1$). In particular, the detected value increases by "$\beta$" compared with the value in the normal state.

Being widely different depending on the size of the movable electrode portion 12 and a configuration of the detection portion 3, capacitance $\beta$ is approximately 1-100 (pF).

As shown in FIGS. 23 and 25, as the object to be detected 20 presses the center portion 12b of the movable electrode portion 12 in a lower direction (direction approaching the substrate 1) through the exterior sheet 5, the movable electrode portion 12 deforms elastically and a portion including the center portion (center section) 12b forms a curved shape that is convex in a lower direction.

This makes the center portion 12b be displaced in a lower direction. In an example shown in the figures, the center portion 12b is displaced to a position that contacts with an upper surface of the insulation layer 113. When the displacement occurs, the movable electrode portion 12 provides the operator with a sense of click.

The state shown in FIGS. 23 and 25 is referred to as "a pressed state".

Since the insulation layer 113 is formed on the upper surface 111a of the fixed electrode portion 111, even if the movable electrode portion 12 reaches the furthermost downward position (the position that contacts with the insulation layer 113) shown in FIGS. 23 and 25, the movable electrode portion 12 does not contact with the fixed electrode portion 111. Therefore, there is no chance for the movable electrode portion 12 to be electrically connected with the fixed electrode portion 111.

If the movable electrode portion 12 and the fixed electrode portion 111 are electrically connected, it is assumed that the capacitance cannot be detected. However, this does not occur, since in the input device 110, the connection between the electrode portions 11, 12 is prevented by the insulation layer 113.

In the pressed state, capacitance $\gamma 2$ formed between the fixed electrode portion 111 and the movable electrode portion 12 is represented by "$\epsilon_2(S/h2')$". $\epsilon_2$ is permittivity between the fixed electrode portion 111 and the movable electrode portion 12 in the pressed state.

Since the distance between the fixed electrode portion 111 and the movable electrode portion 12 (h2' shown in FIGS. 23 and 25) is smaller compared with the distance (h1') of "the approaching state", capacitance $\gamma 2$ is greater compared with capacitance $\gamma 1$ in the approaching state shown in FIGS. 22 and 24.

Therefore, capacitance $(\alpha+\beta+\gamma 2)$ detected by the detection portion 3 is greater than capacitance $(\alpha+\beta+\gamma 1)$ of the approaching state (see FIGS. 22 and 24).

In this case, by making relative permittivity of the insulation layer 113 being greater as described above, an amount of change of capacitance when the state is changed from "the approaching state" to "the pressed state" can be greater.

Being widely different depending on the relative permittivity of the insulation layer 113 and the length of h2', capacitance $\gamma 2$ is approximately 0.04-350 (pF).

The difference of capacitance in the approaching state and the pressed state is $\gamma 2-\gamma 1$. The difference is approximately 0.03-330 (pF).

When the operator stops pressing, due to elastic restoring force of the movable electrode portion 12, the movable electrode portion 12 returns to the original form (shown in FIGS. 22 and 24), and the center portion 12b is displaced in an upper direction. The detected value of capacitance is $(\alpha+\beta+\gamma 1)$.

Leaving the switch element 102, the object to be detected 20 returns to the normal state shown in FIGS. 19 and 21, and the detected value of capacitance is again $(\alpha+\gamma 1)$.

Figure 27:
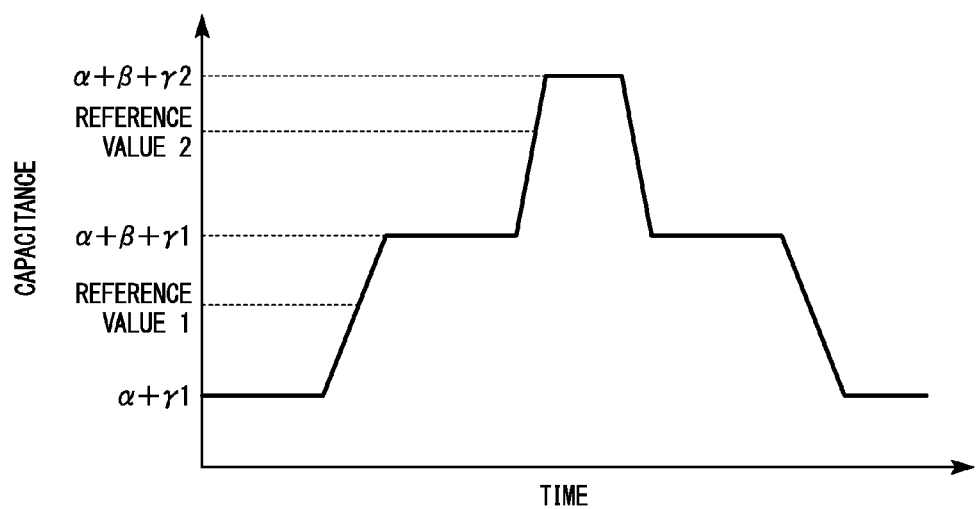
FIG. 27 is a diagram showing a capacitance change in the input device of FIG. 19.

FIG. 27 is a diagram showing the capacitance change in the series of operation. Hereinafter, with reference to the figure, an example of the detection operation in the input device 110 is described.

A reference value 1 (the first reference value) is set in advance between the capacitance $(\alpha+\gamma 1)$ at the normal state and the capacitance $(\alpha+\beta+\gamma 1)$ at the approaching state, and a reference value 2 (the second reference value) is set in advance between the capacitance $(\alpha+\beta+\gamma 1)$ at the approaching state and the capacitance $(\alpha+\beta+\gamma 2)$ at the pressed state.

When the state is changed from the normal state (FIG. 21) to the approaching state (FIG. 22), the capacitance detected by the detection portion 3 increases from $(\alpha+\gamma 1)$ to $(\alpha+\beta+\gamma 1)$ over the reference value 1.

Detecting the capacitance over the reference value 1, the detection portion 3 recognizes that the object to be detected 20 approaches and outputs the first detection signal, and by the first detection signal, any operations (for example, indication to a display of a display portion (not shown)) can be performed.

When the state is changed from the approaching state (FIG. 22) to the pressed state (FIG. 23), the capacitance detected by the detection portion 3 increases from $(\alpha+\beta+\gamma 1)$ to $(\alpha+\beta+\gamma 2)$ over the reference value 2.

Detecting the capacitance over the reference value 2, the detection portion 3 recognizes that the pressing operation is performed and outputs the second detection signal, and by the second detection signal, any operations (for example, indication to a display of a display portion (not shown)) can be performed.

Similarly, when the capacitance is below the reference value 2 with the transition from the pressed state to the approaching state and when the capacitance is below the reference value 1 with the transition from the approaching state to the normal state, respectively, the detection portion 3 outputs a detection signal, and thereby, any operations can be performed.

In the example, by setting two reference values in advance, the detection portion 3 recognizes approaching and leaving the object to be detected 20 and the pressing operation of the switch element 102 separately, and provides switching functions in two stages.

Note that in this example, although two reference values are set, three or more reference values can be used. For example, two or more reference values can be set respectively between $(\alpha+\gamma 1)$ and $(\alpha+\beta+\gamma 1)$ and between $(\alpha+\beta+\gamma 1)$ and $(\alpha+\beta+\gamma 2)$.

Furthermore, the reference value may include hysteresis.

Figure 28A:
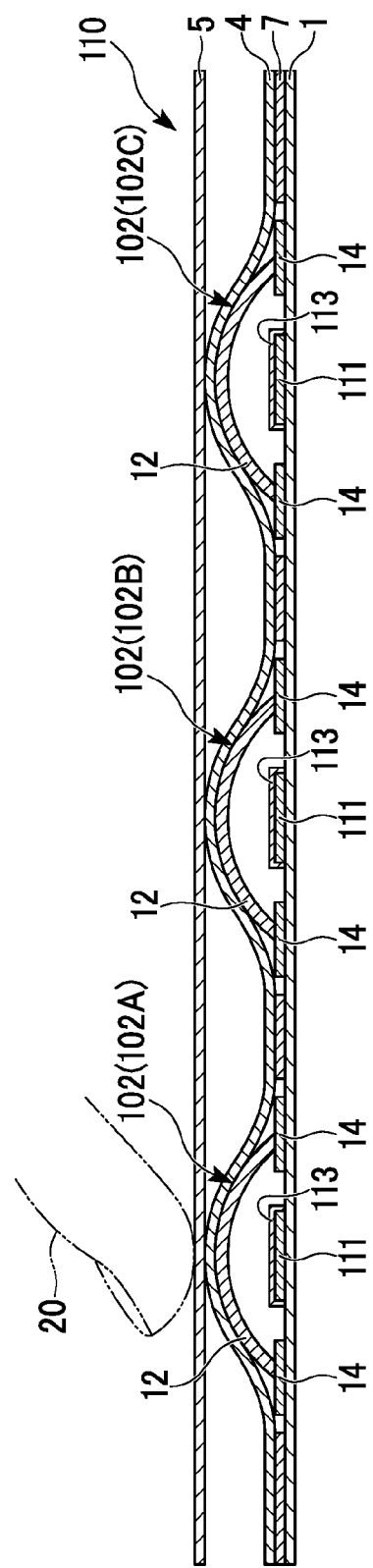
FIG. 28A is an explanatory diagram regarding position detection of the object to be detected in the input device of FIG. 19.
Figure 28B:
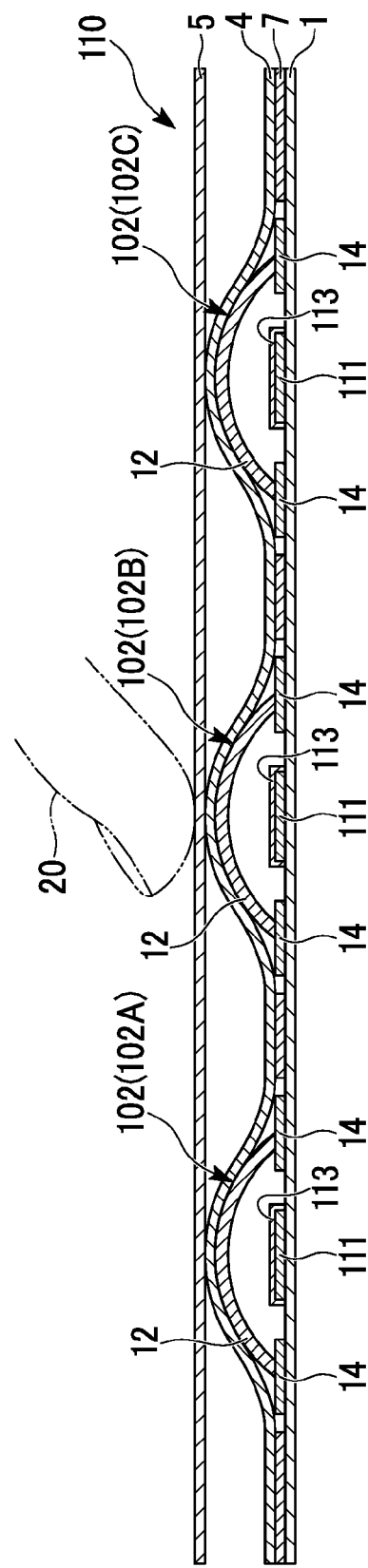
FIG. 28B is an explanatory diagram regarding position detection of the object to be detected in the input device of FIG. 19.
Figure 28C:
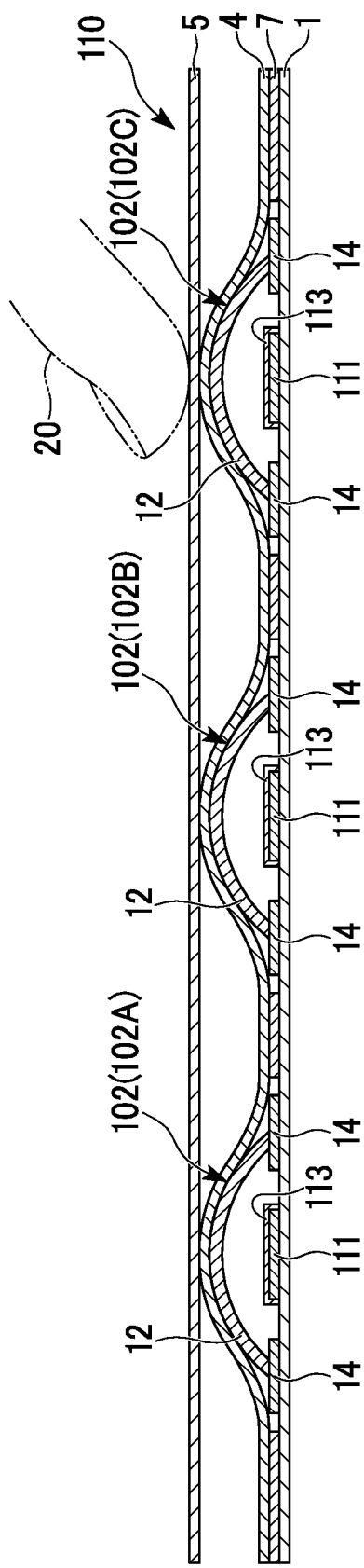
FIG. 28C is an explanatory diagram regarding position detection of the object to be detected in the input device of FIG. 19.

As shown in FIGS. 28A-28C, the input device 110 can detect a flat position (an in-plane position along the substrate 1) of the object to be detected 20.

The assumed case is that the object to be detected 20 moves to the third position (FIG. 28C) adjacent to the third switch element 102 (102C) from the first position (FIG. 28A) adjacent to the first switch element 102 (102A) via the second position (FIG. 28B) adjacent to the second switch element 102 (102B).

At the first position (FIG. 28A), since the object to be detected 20 is adjacent to the first switch element 102A, at the first switch element 102A, a detection value of the capacitance shows a high value. On the other hand, at the second and the third switch elements 102B, 102C in the normal state, a detection value of the capacitance shows a relatively small value.

At the second position (FIG. 28B), since the object to be detected 20 is adjacent to the second switch element 102B, at the second switch element 102B, a detection value of the capacitance shows a high value. On the other hand, at the first and the third switch elements 102A, 102C, a detection value of the capacitance shows a relatively small value.

At the second position (FIG. 28C), since the object to be detected 20 is adjacent to the third switch element 102C, at the third switch element 102C, a detection value of the capacitance shows a high value. On the other hand, at the first and the second switch elements 102A, 102B, a detection value of the capacitance shows a small value.

As described above, depending on the position of the object to be detected 20, a detection value of capacitance at each switch element 102 changes. Therefore, based on the detection value, it is possible to identify the position of the object to be detected 20 and to transfer (or slide) the display screen laterally.

In order to manufacture the input device 110, the resin layer 7 is provided on the main surface 1a of the substrate 1 on which the fixed electrode portion 111, the external electrode portion 14, and the movable electrode portion 12 are formed. Additionally, the insulation layer 113 is formed on the fixed electrode portion 111, the press sheet 4 is formed thereon, and the exterior sheet 5 is further formed thereon.

Thereby, the input device 110 such as shown in FIG. 19 and the like is obtained.

In the input device 110, with a single detection portion 3, it is possible to detect a capacitance change due to a position change when the object to be detected 20 approaches and leaves, and also to detect a capacitance change when the movable electrode portion 12 is displaced due to a pressing operation. In particular, a capacitance change in two stages can be detected by the single detection portion 3. As a result, a circuit for detecting a position of the object to be detected 20 and a circuit for detecting a pressing operation of the movable electrode portion 12 can be a common circuit, and thereby, a circuit configuration inside the device can be simplified. Therefore, it is advantageous for such as reducing costs, ease of manufacture, and downsizing the device.

In the input device 110, the pressing operation of the movable electrode portion 12 is detected by the capacitance change. Therefore, compared to a configuration that detects the pressing operation by the electrical connection of the electrode portion, a current flowing in the circuit at the time of the detection does not increase rapidly, and failures caused by the rapid increase of the current do not occur.

Additionally, unlike the configuration that detects the pressing operation by the electrical connection of the electrode portion, the contact failure does not occur that is caused by foreign substance contamination, corrosion of the electrode portion and the like. Therefore, the detection sensitivity is not decreased.

In the input device 110, since all of the fixed electrode portion 111, the movable electrode portion 12, and the external electrode portion 14 are provided on the main surface 1a of the substrate 1, an inexpensive one-side substrate can be used, and thus, it is possible to reduce costs.

Note that however, a both-side substrate can also be used. In the fixed electrode portion 111 and the external electrode portion 14, a through hole conducting from the main surface 1a to a rear surface of the substrate can be formed, and a wiring layer can be formed at the rear surface.

The technical scope of the present invention is not limited to the above-mentioned exemplary embodiments, and various modifications can be made within a scope that does not depart from the gist of the present invention.

Figure 29:
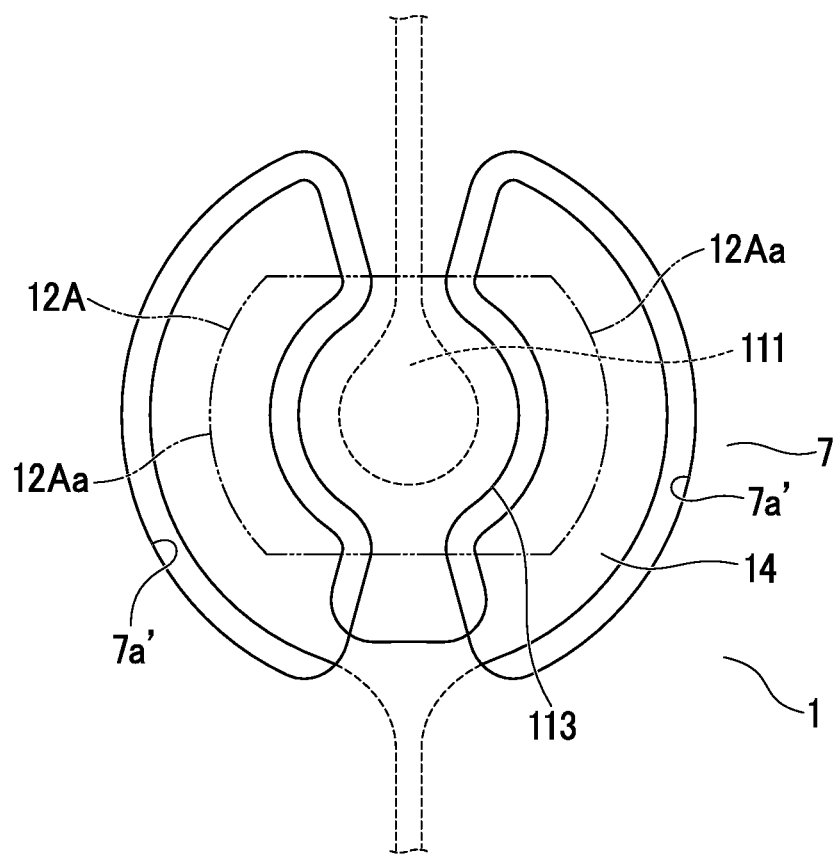
FIG. 29 is a plane diagram showing an input device including another example of a movable electrode portion.

The shape of the movable electrode portion 12 is not limited to those shown in the figures. For example, as shown in FIG. 29, the movable electrode portion 12 may have an arch shape that is constituted by a plate with a constant width extending from side to side when seen from a planar view and both base end portions 12Aa are formed on the external electrode portion 14. In this example, an opening portion 7a' of the resin layer 7 has a fan shape corresponding to a shape that is made by dividing the opening portion 7a, which has a C shape when seen from a planar view as shown in FIG. 20, at a center in a longitudinal direction.

In addition, in an example shown in the figures, the input device 110 includes a plurality of switch elements 102; however, the number of the switch element 102 can be one.

In addition, in an example shown in the figures, the external electrode portion 14 has a C shape roughly surrounding the fixed electrode portion 111 when seen from a planar view. However, the external electrode portion 14 may be formed around the fixed electrode portion 111, for example, may be formed only at two areas facing each other through the fixed electrode portion 111.

Figure 30:
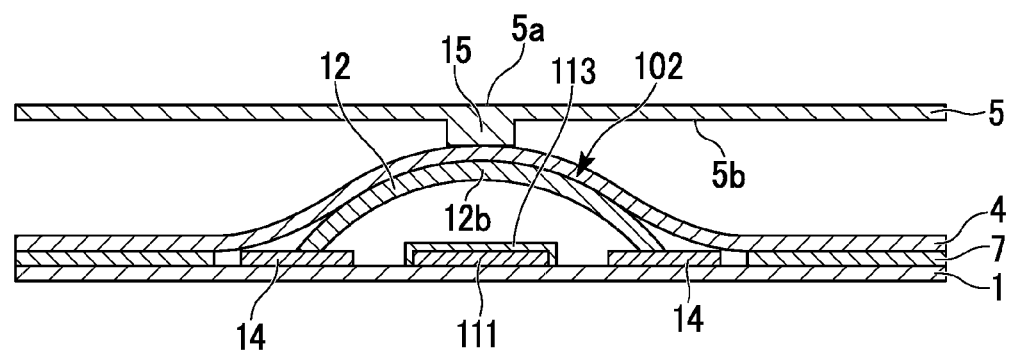
FIG. 30 is a cross-sectional diagram showing an example of an input device using an exterior sheet having protruding portions.

As shown in FIG. 30, on a lower surface 5b of the exterior sheet 5, a protruded portion (pressure transmission portion) 15 can be formed.

The protruded portion 15 is a thick portion having a circular shape, a polygonal shape, and the like when seen from a planar view, and formed by protruding from the lower surface 5b toward a lower direction. The position where the protruded portion 15 is formed preferably includes a position which overlaps with the center portion 12b of the movable electrode portion 12 when seen from a planar view.

In the input device, when the operator presses the exterior sheet 5, the protruded portion 15 is displaced in a downward direction and presses the center portion 12b of the movable electrode portion 12 through the press sheet 4. Since the pressure concentrates and acts at the movable electrode portion 12 through the protruded portion 15, the pressure can efficiently act at the movable electrode portion 12. This improves the reliability of the operation and ensures a favorable clicking touch.

Additionally, even when a position pressed by the operator seen from a planar view is apart from the center of the movable electrode portion 12, the pressure is transmitted to a proper position of the movable electrode portion 12 through the protruded portion 15; thereby an erroneous operation can be prevented.

Figure 31:
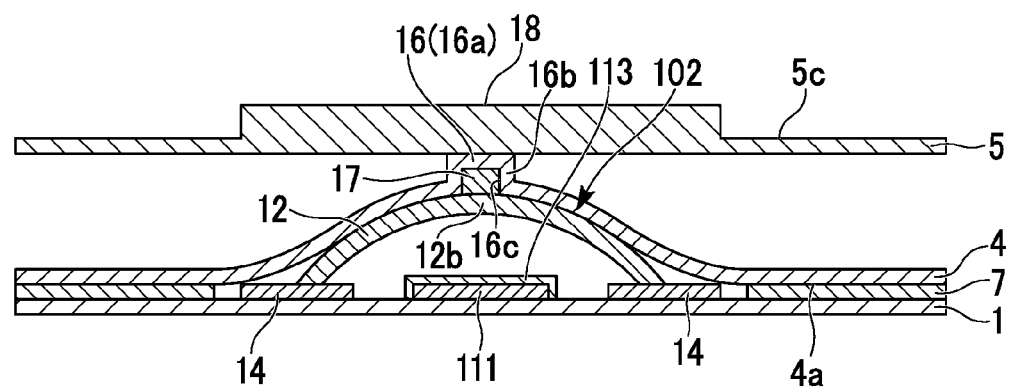
FIG. 31 is a cross-sectional diagram showing an example of an input device using a pressure transmission member.

FIG. 31 is a cross-sectional diagram showing an example of an input device using a pressure transmission member, and in the input device, the press sheet 4 has a projected portion 16 that is projected in an upper direction. An example of the projected portion 16 shown in the figure includes an upper plate 16a and a side plate 16b drooping from a periphery of the upper plate 16a. A shape of the projected portion 16 seen from a planar view may be a circular shape, a polygonal shape, and the like.

A side of an inner surface (side of a lower surface) of the projected portion 16 is a concave housing portion 16c, and the pressure transmission member 17 is accommodated inside the concave housing portion 16c. Since the pressure transmission member 17 is accommodated in the concave housing portion 16c of the press sheet 4, the pressure transmission member 17 is less likely to shift laterally.

The pressure transmission member 17 can be a shape that fits the inner shape of the concave housing portion 16c, for example, a block shape such as a column, a cuboid and the like. The position where the pressure transmission member 17 is formed preferably includes a position which overlaps with the center portion 12b of the movable electrode portion 12 when seen from a planar view.

In the input device, since the pressure transmission member 17 is placed between the upper surface of the movable electrode portion 12 and the press sheet 4, the pressure from the operator concentrates and acts at the movable electrode portion 12 through the pressure transmission member 17. Therefore, the pressure can efficiently act at the movable electrode portion 12. This improves the reliability of the operation and ensures a favorable clicking touch.

Additionally, even when a position pressed by the operator seen from a planar view is apart from the center of the movable electrode portion 12, the pressure is transmitted to a proper position of the movable electrode portion 12 through the pressure transmission member 17; thereby an erroneous operation can be prevented.

On an upper surface 5c of the exterior sheet 5, a convex portion for operation 18 can be formed. The convex portion for operation 18 is a thick portion having a circular shape, a polygonal shape, and the like when seen from a planar view. The position where the convex portion for operation 18 is formed preferably includes a position which overlaps with the center portion 12b of the movable electrode portion 12 when seen from a planar view.

By the convex portion for operation 18, the pressure from the operator is more reliably transmitted to the movable electrode portion 12.

Figure 33:
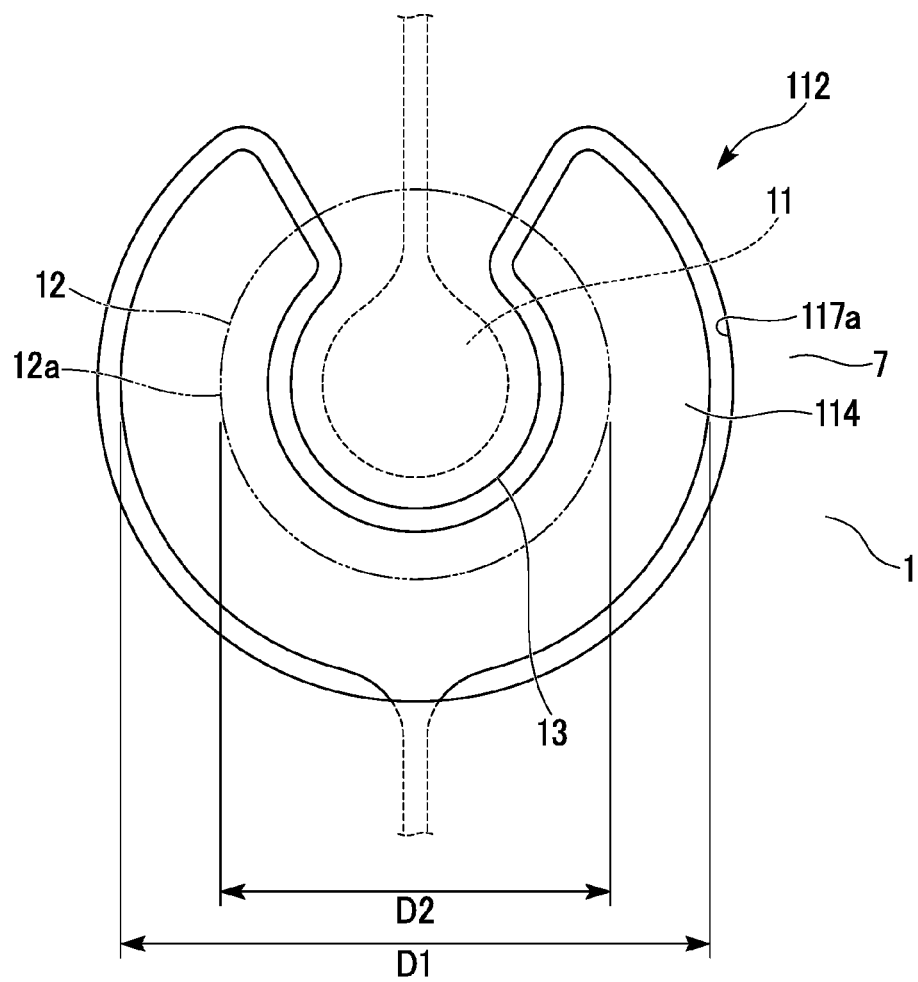
FIG. 33 is a plane diagram showing another example of an input device.

FIG. 33 shows another example of a switch element, and a switch element 112 described here uses an external electrode portion 114 instead of the external electrode portion 14, which is different from the switch element 2 shown in FIG. 14. Other configurations may be the same as the switch element 2.

The external electrode portion 114 is preferably formed such that a center position thereof corresponds to a center position of the movable electrode portion 12. The external electrode portion 114 in the example shown in the figures has an approximate C shape where a center position thereof approximately corresponds to a center position of the movable electrode portion 12.

The external electrode portion 114 is formed at a region including the movable electrode portion 12 when seen from a planar view, and compared to the external electrode portion 14 shown in FIG. 14, the external electrode portion 114 has a larger outer diameter (outer dimension). An outer diameter D1 of the external electrode portion 114 is preferably 1.5 times (preferably, 2 times) larger than an outer diameter D2 of the external electrode portion 12.

On the resin layer 7, an opening portion 117a having an approximate C shape, which is slightly larger than the external electrode portion 114, when seen from a planar view is formed, and the external electrode portion 114 is formed inside the opening portion 117a.

Figure 34:
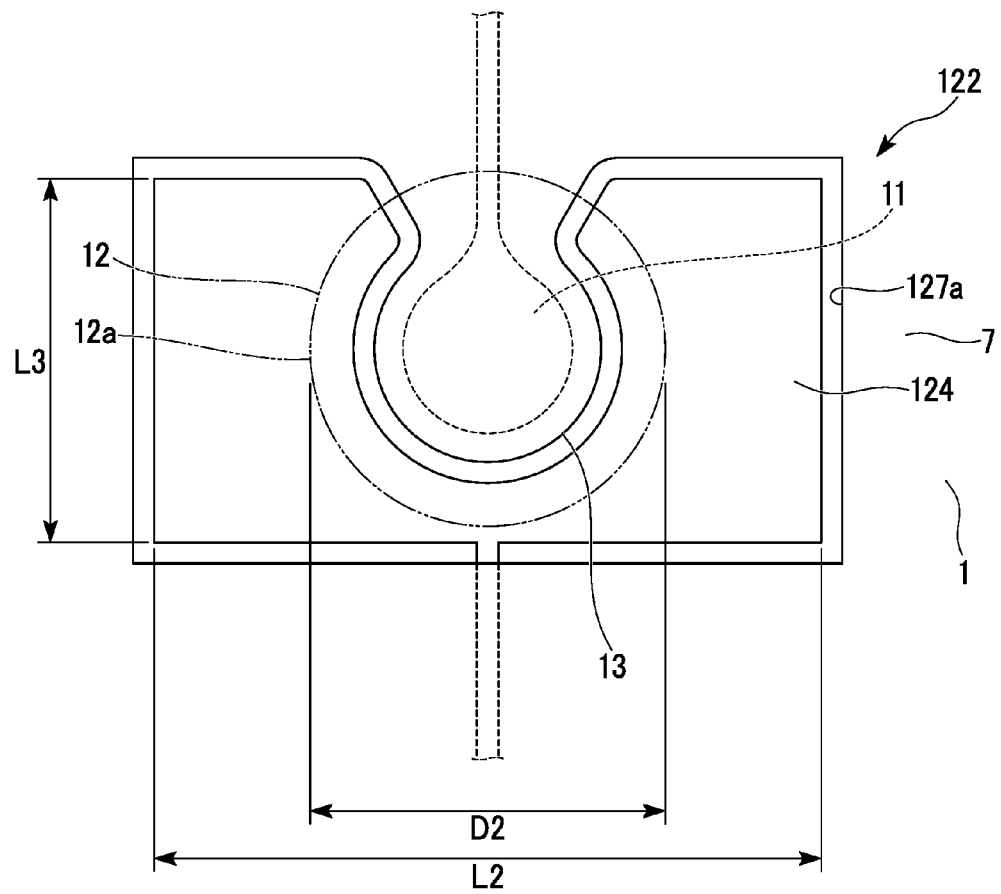
FIG. 34 is a plane diagram showing another example of an input device.

FIG. 34 shows other example of a switch element, and a switch element 122 described here uses an external electrode portion 124 instead of the external electrode portion 14, which is different from the switch element 2 shown in FIG. 14. Other configurations may be the same as the switch element 2.

The external electrode portion 124 is an approximate rectangle (approximate rectangular shape) when seen from a planar view. The external electrode portion 124 is formed at a region including the movable electrode portion 12 when seen from a planar view. A length L2 of the external electrode portion 124 in a longitudinal direction is preferably 1.5 times (preferably, 2 times) larger than the outer diameter D2 of the external electrode portion 12. A length L3 of the external electrode portion 124 in a width direction is preferably larger than the outer diameter D2 of the external electrode portion 12.

On the resin layer 7, an opening portion 127a having an approximate rectangle, which is slightly larger than the external electrode portion 124, is formed, and the external electrode portion 124 is formed inside the opening portion 127a.

In the switch elements 112 and 122 shown in FIGS. 33 and 34, since areas of the external electrode portions 114 and 124 are large, capacitance generated between the switch elements and the object to be detected 20 becomes large. Therefore, the capacitance change when the object to be detected 20 approaches the switch elements 112 and 122 and when the object to be detected 20 presses the movable electrode portion 12 becomes large, and the object to be detected 20 can be easily detected.

During the detection of the capacitance change with two stages, since an allowance range of the change per stage is inevitably small compared to the detection of the capacitance change with one stage. This may raise difficulties in the capacitance detection with high accuracy. However, in the switch elements 112 and 122, since the entire range of the capacitance change can be large, the amount of capacitance change per stage can be relatively large. Therefore, the amount of capacitance change at each stage can be detected with high accuracy.

For example, in FIG. 9, reference values 1 and 2 can be large and thereby, it is ensured that the difference between the reference values 1 and 2 is large. Therefore, the detection of the capacitance change based on the comparison of each reference value can be reliably performed.

The present invention is not limited to the above-mentioned examples, and modifications and additions of the number of each configuration, position, dimension, value, and the like can be made within a scope that does not depart from the gist of the present invention.

The input device of the present invention may be used not only for a mobile phone, but also for a mobile information device such as a personal digital assistant (PDA) and a personal computer.

What is claimed is:

1. An input device comprising an insulation substrate, a switch element provided on the substrate, and a detection portion that detects a capacitance change at the switch element, wherein:
    the switch element comprises a fixed electrode portion that is provided on the substrate, and a movable electrode portion that is provided on a main surface side of the substrate, at least part of the movable electrode portion being elastically displaceable toward a direction approaching and leaving the fixed electrode portion;
    the movable electrode portion is displaceable toward a direction approaching the fixed electrode portion due to pressure from an object to be detected that is an electric conductor;
    the detection portion is capable of detecting a capacitance change caused by the object to be detected approaching and leaving the movable electrode portion and a capacitance change between the movable electrode portion and the fixed electrode portion produced by displacement of the movable electrode portion due to pressing the fixed electrode portion is electrically insulated with respect to the movable electrode portion and is connected to ground; and
    at least on a surface of a movable electrode portion side of the fixed electrode portion, an insulation portion is formed that prevents the movable electrode portion from being electrically connected to the fixed electrode portion when the movable electrode portion is displaced toward a direction approaching the fixed electrode portion, wherein
        the movable electrode portion is electrically connected to an external electrode portion provided on a main surface side of the substrate,
        the external electrode portion is formed at a periphery of the fixed electrode portion when seen from a planar view, and
        a distance of a radial direction between the external electrode portion and the fixed electrode portion when seen from the planar view is greater than a maximum displacement distance of the movable electrode portion in an upper and lower direction which is perpendicular to the radial direction.

2. The input device according to claim 1, wherein the movable electrode portion is a domical shape or an arch shape which is protruded toward a direction leaving the substrate, and an approximate center portion is elastically displaceable toward a direction approaching and leaving the fixed electrode portion.

3. The input device according to claim 1, wherein:
    the external electrode portion is formed at a region comprising the movable electrode portion when seen from a planar view; and an outside dimension of the external electrode portion is 1.5 times larger than an outside dimension of the movable electrode portion.

4. The input device according to claim 1, wherein the fixed electrode portion is provided at a surface side which is opposite to the main surface side of the substrate.

5. The input device according to claim 4, wherein a height adjustment unit that regulates a shift of the movable electrode portion toward a direction approaching the substrate is formed at the main surface side of the substrate.

6. The input device according to claim 5, wherein the height adjustment unit is formed in laminate along the main surface.

7. The input device according to claim 1, wherein:
the fixed electrode portion is provided on the main surface side of the substrate.

8. The input device according to claim 7, wherein the insulation portion is made of one resin or two or more resins selected from a group of an acrylic resin, a urethane resin, a polyester resin, a polyimide resin, and an epoxide resin.

9. The input device according to claim 7, wherein relative permittivity of the insulation portion is 1.5 to 10.

10. The input device according to claim 7, wherein a thickness of the insulation portion is 5 μm or more.

11. The input device according to claim 7, wherein a difference in height between an upper surface of an insulation layer and an upper surface of the external electrode portion based on the main surface of the substrate is 0 or more, and is within a range of less than or equal to one-tenth of a distance between the fixed electrode portion and a portion of the movable electrode portion that faces to the fixed electrode portion.

12. The input device according to claim 1, wherein the insulation portion is the substrate.

* * * * *